(12) United States Patent
Inoue et al.

(10) Patent No.: US 8,228,137 B2
(45) Date of Patent: *Jul. 24, 2012

(54) FILTER, DEMULTIPLEXER, AND MODULE INCLUDING DEMULTIPLEXER, COMMUNICATION APPARATUS

(75) Inventors: Shogo Inoue, Kawasaki (JP); Jun Tsutsumi, Kawasaki (JP); Takashi Matsuda, Kawasaki (JP); Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 144 days.

This patent is subject to a terminal disclaimer.

(21) Appl. No.: 12/709,182

(22) Filed: Feb. 19, 2010

(65) Prior Publication Data
US 2010/0150075 A1  Jun. 17, 2010

Related U.S. Application Data

(63) Continuation of application No. PCT/JP2008/058416, filed on May 2, 2008.

(30) Foreign Application Priority Data

Aug. 23, 2007  (WO) .................. PCT/JP2007/066393

(51) Int. Cl.
*H03H 7/46* (2006.01)
*H04B 1/48* (2006.01)
*H03H 9/52* (2006.01)
*H03H 9/70* (2006.01)

(52) U.S. Cl. ........ 333/126; 333/129; 333/132; 333/133; 333/25; 455/78; 455/82

(58) Field of Classification Search .......... 333/124–129, 333/132–135, 25, 4; 455/78, 82, 83
See application file for complete search history.

(56) References Cited

U.S. PATENT DOCUMENTS

| 4,247,836 A | 1/1981 | Redwood et al. |
| 4,931,755 A | 6/1990 | Sakamoto et al. |
| RE37,639 E * | 4/2002 | Ehara et al. .................. 333/193 |
| 6,472,959 B1 | 10/2002 | Beaudin et al. |

(Continued)

FOREIGN PATENT DOCUMENTS

EP  1 480 337 A1  11/2004

(Continued)

OTHER PUBLICATIONS

International Search Report (ISR) issued in PCT/JP2008/073752 mailed in Mar. 2009.

(Continued)

*Primary Examiner* — Barbara Summons
(74) *Attorney, Agent, or Firm* — Chen Yoshimura LLP

(57) ABSTRACT

A demultiplexer has a common terminal, a transmission terminal, and a reception terminal, and furthermore includes a transmission filter connected between the common terminal and the transmission terminal, a reception filter connected between the common terminal and the reception terminal, and a phase shift circuit connected in series to the reception filter connected between the common terminal and the reception terminal. A node on the line from the phase shift circuit to the common terminal or the transmission terminal, and a node on the line from the phase shift circuit to the reception terminal are coupled via a reactance. Accordingly, it is possible to fundamentally reduce or eliminate the situation in which transmission signals from the transmission filter arrive at the reception circuit, and improve isolation.

14 Claims, 26 Drawing Sheets

U.S. PATENT DOCUMENTS

| | | |
|---|---|---|
| 6,525,624 B1 | 2/2003 | Hikita et al. |
| 6,566,981 B2 | 5/2003 | Urabe et al. |
| 6,759,924 B2 | 7/2004 | Sakuragawa et al. |
| 6,917,258 B2 * | 7/2005 | Kushitani et al. ............ 333/103 |
| 6,940,368 B2 | 9/2005 | Plessky et al. |
| 6,972,644 B2 | 12/2005 | Nishizawa et al. |
| 7,030,716 B2 | 4/2006 | Tsutsumi et al. |
| 7,154,359 B2 | 12/2006 | Inoue et al. |
| 7,164,306 B2 | 1/2007 | Makino |
| 7,479,850 B2 | 1/2009 | Kearns et al. |
| 7,554,419 B2 | 6/2009 | Inoue et al. |
| 2001/0043024 A1 | 11/2001 | Takamine et al. |
| 2002/0014121 A1 | 2/2002 | Urabe et al. |
| 2002/0158708 A1 | 10/2002 | Inoue et al. |
| 2003/0112768 A1 * | 6/2003 | Frank ........................... 370/281 |
| 2004/0070469 A1 | 4/2004 | Plessky et al. |
| 2004/0219888 A1 | 11/2004 | Iwamoto et al. |
| 2004/0233019 A1 | 11/2004 | Inoue et al. |
| 2005/0046520 A1 | 3/2005 | Nishizawa et al. |
| 2005/0281210 A1 | 12/2005 | Makino |
| 2006/0091977 A1 | 5/2006 | Inoue et al. |
| 2007/0001786 A1 | 1/2007 | Kundu |
| 2007/0268092 A1 | 11/2007 | Inoue et al. |
| 2008/0007370 A1 * | 1/2008 | Matsumoto ................... 333/194 |
| 2009/0058557 A1 * | 3/2009 | Tsurunari et al. ............ 333/133 |
| 2009/0273408 A1 | 11/2009 | Inoue et al. |
| 2010/0026414 A1 | 2/2010 | Iwaki et al. |
| 2010/0026419 A1 * | 2/2010 | Hara et al. ................... 333/175 |
| 2010/0109800 A1 | 5/2010 | Ueda et al. |
| 2010/0150075 A1 | 6/2010 | Inoue et al. |
| 2010/0244979 A1 * | 9/2010 | Matsuda et al. ............. 333/100 |
| 2011/0254639 A1 | 10/2011 | Tsutsumi et al. |

FOREIGN PATENT DOCUMENTS

| | | | |
|---|---|---|---|
| EP | 1 482 639 A2 | 12/2004 | |
| EP | 1 653 615 A1 | 5/2006 | |
| EP | 1 860 773 A2 | 11/2007 | |
| EP | 1 883 159 A1 | 1/2008 | |
| JP | 60-043808 A | 3/1985 | |
| JP | 60-126809 A | 7/1985 | |
| JP | 4-249906 A | 9/1992 | |
| JP | 5-055855 A | 3/1993 | |
| JP | 06-152317 A | 5/1994 | |
| JP | 7-226602 A | 8/1995 | |
| JP | 09-167937 A | 6/1997 | |
| JP | 10-256809 A | 9/1998 | |
| JP | 11-214908 A | 8/1999 | |
| JP | 11-251861 A | 9/1999 | |
| JP | 11-346142 | * 12/1999 | |
| JP | 2000-022493 A | 1/2000 | |
| JP | 2001-186033 | * 7/2001 | |
| JP | 2002-076829 A | 3/2002 | |
| JP | 2002-84165 A | 3/2002 | |
| JP | 2003-249841 A | 9/2003 | |
| JP | 2004-523176 T | 7/2004 | |
| JP | 2004-336181 A | 11/2004 | |
| JP | 2004-349893 A | 12/2004 | |
| JP | 2005-045099 A | 2/2005 | |
| JP | 2005-184773 A | 7/2005 | |
| JP | 2006-60747 A | 3/2006 | |
| JP | 2006-135447 A | 5/2006 | |
| JP | 2006-135921 A | 5/2006 | |
| JP | 2006-311041 | * 11/2006 | |
| JP | 2007-312324 A | 11/2007 | |
| WO | WO 02/071610 A1 | 9/2002 | |
| WO | 2006/118039 A1 | 11/2006 | |
| WO | 2009/025106 A1 | 2/2009 | |
| WO | 2010/073377 A1 | 7/2010 | |

OTHER PUBLICATIONS

Written Opinion (PCT/ISA/237) issued in PCT/JP2008/073752 mailed in Mar. 2009.

The Office Action dated Nov. 9, 2011, in the U.S. Appl. No. 13/167,620.

Pending U.S. Appl. No. 12/512,571, filed Jul. 30, 2009.

International Search Report (ISR) issued in PCT/JP2008/058416 (parent application) mailed in Aug. 2009.

* cited by examiner j : Phase characteristics of capacitance CB
g2 : Pass characteristics of ladder filter with bridging capacitance CB
h2 : Phase characteristics of ladder filter with bridging capacitance CB

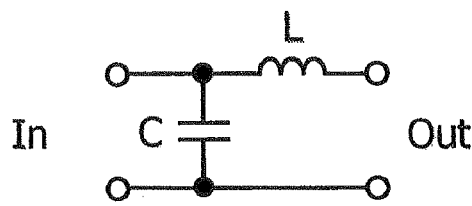
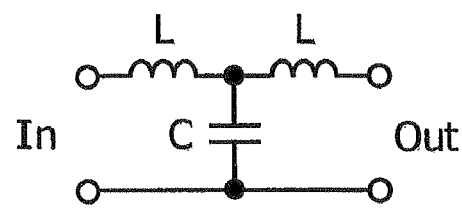
FIG. 21A  FIG. 21B
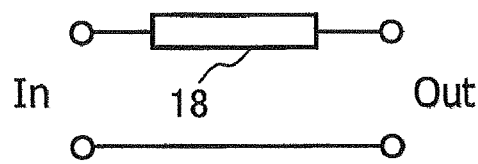
FIG. 21C
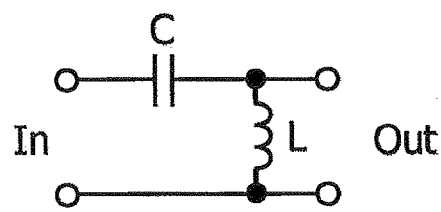
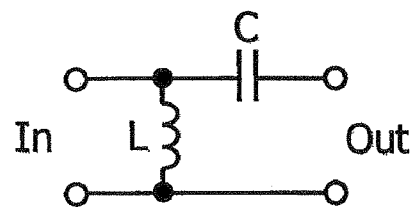
FIG. 22A  FIG. 22B
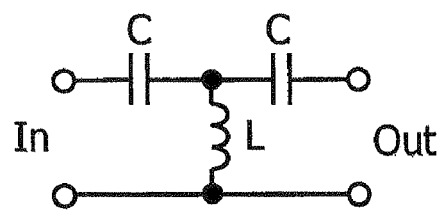
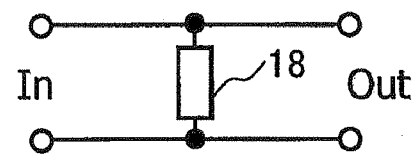
FIG. 22C  FIG. 22D

FILTER, DEMULTIPLEXER, AND MODULE INCLUDING DEMULTIPLEXER, COMMUNICATION APPARATUS

CROSS-REFERENCE TO RELATED APPLICATION

This application is based upon and claims the benefit of priority of the prior International Patent Application No. PCT/JP2008/058416, filed on May 2, 2008 and International Patent Application No. PCT/JP2007/066393, filed on Aug. 23, 2007, the entire contents of which are incorporated herein by reference.

FIELD

The present invention relates to a filter and a demultiplexer that are connected to an antenna of a communication device typified by, for example, a mobile phone, and also relates to a module and a communication device that include the demultiplexer.

BACKGROUND

FIG. 14 is a diagram depicting a configuration of a conventional antenna demultiplexer. A conventional antenna demultiplexer 81 is configured such that a transmission filter 82 is connected between a common terminal Ant and a transmission terminal Tx, and a reception filter 83 is connected between the common terminal Ant and a reception terminal Rx. In the case in which the antenna demultiplexer 81 is used in, for example, a mobile phone, the common terminal Ant is connected to an antenna, the transmission terminal Tx is connected to a transmission circuit, and the reception terminal Rx is connected to a reception circuit.

The passband of the transmission filter 82 and the passband of the reception filter 83 are different, and therefore when a transmission signal that has been input to the transmission terminal Tx passes through the transmission filter 82, such transmission signal is output from the common terminal Ant to the antenna without flowing to the reception filter 83 side. The transmission signal is then converted to radio waves and emitted by the antenna. On the other hand, a reception signal that has been received by the antenna passes through the reception filter 83, and is input from the reception terminal Rx to the reception circuit. This is the flow of signals in an ideal antenna demultiplexer.

However, in an actual antenna demultiplexer, not all of the transmission signals that have been output from the transmission filter 82 are output from the common terminal Ant to the antenna, but rather a portion of such transmission signals flow to the reception filter 83 and arrive at the reception terminal Rx. For this reason, reception signals that are input from the reception terminal Rx to the reception circuit include noise, and as a result, there is the problem that reception performance deteriorates.

Here, transmission-reception isolation (hereinafter, simply called isolation) is used as a value indicating the degree to which transmission signals that have been input from the transmission circuit to the transmission terminal Tx, leaked to the reception filter 83 side, and arrived at the reception terminal Rx, can be suppressed. Normally, the isolation of an antenna demultiplexer is approximately 50 dB. This isolation value of 50 dB is not sufficient for satisfying the performance required for antenna demultiplexers.

Conventionally, a filter has been added within the reception circuit in order to prevent such deterioration in reception performance, but this has led to an increase in the number of parts, cost, and complexity. Accordingly, improving isolation in antenna demultiplexers has become an industry-wide issue in mobile phone designing.

In view of this, there has been a proposal for a structure for removing unnecessary electromagnetic coupling in antenna demultiplexers, which is one cause for the leakage of transmission signals from the transmission circuit to the reception circuit (e.g., see the below Patent document 1 and Patent document 2). Patent document 1 discloses a configuration in which a shield electrode is provided in order to remove unnecessary electromagnetic coupling. Patent document 2 discloses an example in which unnecessary electromagnetic coupling is prevented by an innovation in the connection with the ground terminal of the antenna demultiplexer package.

Patent document 1: Japanese Laid-open Patent Publication JP 2006-60747A

Patent document 2: Japanese Laid-open Patent Publication JP 2002-76829A

However, the configurations disclosed in the above Patent documents 1 and 2 merely remove unnecessary electromagnetic coupling, and do not fundamentally reduce or eliminate leaked signals from the transmission filter, or improve isolation. In order to fundamentally suppress such leaked signals, it is necessary to raise the degree of suppression in the filter suppression band.

SUMMARY

A filter disclosed in the present application includes: a filter unit that passes and outputs, among input signals, a signal in a passband; a phase shift circuit that is connected to an input side or an output side of the filter unit, and that shifts a phase of signals; and a bridging capacitance that is provided so as to span the phase shift circuit and the filter unit.

The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF DRAWINGS

FIG. 21A is a diagram depicting a variation of the phase shift circuit.

FIG. 21B is a diagram depicting a variation of the phase shift circuit.

FIG. 21C is a diagram depicting a variation of the phase shift circuit.

FIG. 22A is a diagram depicting a variation of the phase shift circuit.

FIG. 22B is a diagram depicting a variation of the phase shift circuit.

FIG. 22C is a diagram depicting a variation of the phase shift circuit.

FIG. 22D is a diagram depicting a variation of the phase shift circuit.

DESCRIPTION OF EMBODIMENTS

Figure 1:
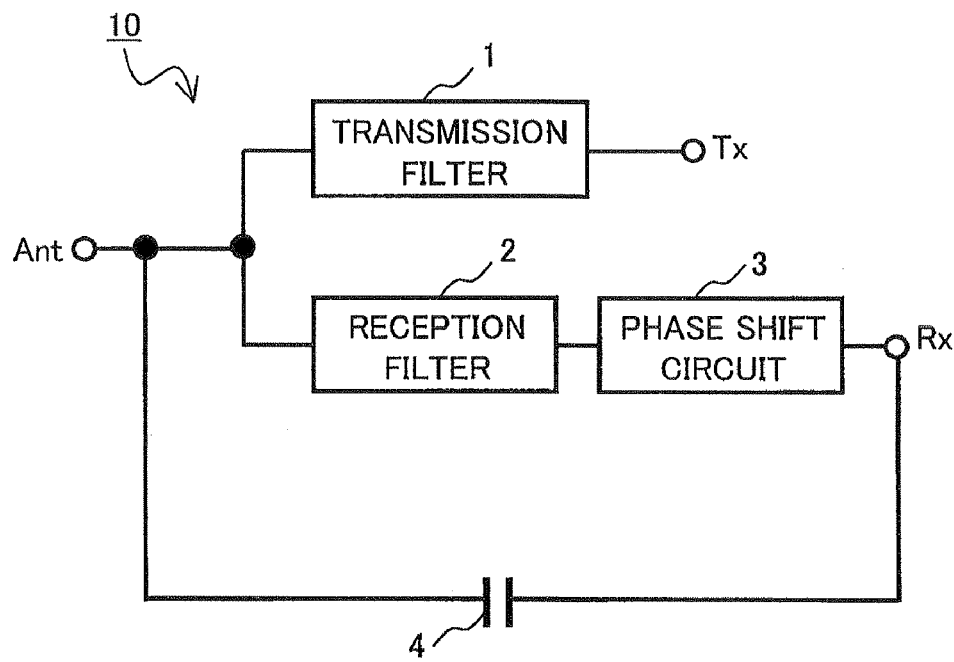
FIG. 1 is a diagram depicting a schematic configuration of an antenna demultiplexer according to Embodiment 1.

In the Filter disclosed in the present application, the bridging capacitance is provided so as to span the phase shift circuit and filter unit, and therefore by appropriately setting the bridging capacitance value and the phase shift angle of the phase shift circuit, it is possible to cause signals that have passed through the bridging capacitance and signals that have passed through the phase shift circuit and the filter unit to cancel each other out in the frequency region (suppression band) outside the passband. For this reason, according to the above configuration, signals in the suppression band are further suppressed, and it is possible to realize a filter having a high degree of suppression.

A demultiplexer disclosed in the present application is a demultiplexer that has a common terminal, a transmission terminal, and a reception terminal, including: a transmission filter that is connected between the common terminal and the transmission terminal; a reception filter that is connected between the common terminal and the reception terminal; and a phase shift circuit that is connected in series to the reception filter between the common terminal and the reception terminal, a portion on a line from the phase shift circuit to the common terminal or the transmission terminal, and a portion on a line from the phase shift circuit to the reception terminal being coupled via a reactance.

In the above demultiplexer, transmission signals that have been input to the transmission terminal pass through the transmission filter and are output from the common terminal. At this time, a portion of the transmission signals is not output from the common terminal, but instead leaks to the reception filter side. Such transmission signals that have leaked to the reception filter side pass through the reception filter and the phase shift circuit, are phase adjusted, and arrive at the reception terminal. Simultaneously with this, transmission signals are pulled out from a portion on the line from the phase shift circuit to the common terminal or the transmission terminal by the coupling via the reactance, and arrive at the reception terminal. Accordingly, by appropriately setting the phase shift angle of the phase shift circuit, it is possible for the transmission signals that have been pulled out by the coupling via the reactance, and the transmission signals that have passed through the reception filter and the phase shift circuit and have been phase adjusted to cancel each other out at the reception terminal. In other words, the above demultiplexer is configured so that it is possible to fundamentally reduce or eliminate transmission signals that have leaked to the reception filter side and arrived at the reception terminal, by appropriately setting the phase shift angle of the phase shift circuit. As a result, a demultiplexer having improved isolation is obtained.

The disclosure of this application enables fundamentally reducing or eliminating transmission signals that leak from a transmission filter to a reception filter side, and improving isolation.

In an embodiment of the present invention, preferably a phase shift angle of the phase shift circuit is set so that a phase of a signal that has been output via the bridging capacitance and a phase of a signal that has been output via the phase shift circuit and the filter are antiphase outside the passband of the filter unit.

Accordingly, outside the passband of the filter unit, signals that have passed through the bridging capacitance and signals that have passed through the filter unit become mutually antiphase and cancel each other out. Output signals outside the passband (in the suppression band) are therefore reduced. In other words, an attenuation pole appears in the suppression band. As a result, the degree of suppression of the filter increases.

In an embodiment of the present invention, the filter may include a balanced-unbalanced converter that has a common terminal, divides a signal that has been input from the common terminal into two signals that are mutually antiphase, and output the two signals via two output terminals respectively, wherein the filter unit includes two filter units respectively connected to the two output terminals via which the balanced-unbalanced converter performs output, the balanced-unbalanced converter is included in the phase shift circuit, and the bridging capacitance is provided so as to bridge the common terminal and either one of output sides of the two filter units that are respectively connected to the two output terminals.

In the above configuration, a signal that has been input from the common terminal is phase-adjusted by the balanced-unbalanced converter so as to become mutually antiphase signals, and such signals are output from the two output terminals, and pass through the filter unit. The signal that has been output from one of the two output terminals and has passed through the filter unit merges with the signal from the common terminal that has passed through the bridging capacitance. For this reason, in the above configuration, by appropriately setting the bridging capacitance value, it is possible to perform adjustment so that the phase of signals that have passed through the bridging capacitance and the phase of any signals that have passed through the filter unit become mutually antiphase and cancel each other out.

In an embodiment of the present invention, the phase shift circuit and the filter unit may have been formed in a package or on a substrate, and the bridge may have been formed in the package or the substrate.

This realizes an improvement in the degree of suppression while keeping the size of the filter small.

In an embodiment of the present invention, preferably the phase shift circuit performs phase adjustment so that a phase difference between a signal from the portion on the line from the phase shift circuit to the common terminal or the transmission terminal that has passed through the coupling via the reactance and arrived at the reception terminal, and a signal that has passed through the phase shift circuit and arrived at the reception terminal is substantially 180 degrees.

The phase shift circuit adjusts the phase difference between the transmission signal that has passed through the phase shift circuit and arrived at the reception terminal and the transmission signal that has passed through the coupling via the reactance and arrived at the reception terminal to substantially 180 degrees. For this reason, there is an increase in the effect in which the transmission signal that has been pulled out by the coupling via the reactance, and the transmission signal that has passed through the reception filter and the phase shift circuit and has been phase-adjusted, cancel each other out at the reception terminal.

In an embodiment of the present invention, the phase shift circuit may be provided on a reception terminal side of the reception filter, and a portion on a line from the reception filter to the transmission filter or the common terminal, and a portion on a line on the reception terminal side of the phase shift circuit may be coupled via a reactance. According to this configuration, a demultiplexer having improved isolation is obtained with a simpler configuration.

In an embodiment of the present invention, a portion on a line from the phase shift circuit to the common terminal or the transmission filter, and a portion on a line from the phase shift circuit to a reception terminal may be coupled via a reactance, and furthermore a portion on a line from the transmission filter to the transmission terminal, and a portion on a line from the phase shift circuit to a reception terminal may be coupled via a reactance.

The phase of transmission signals that have been input from the transmission terminal tends to be somewhat different before and after passing through the transmission filter. In this case, the amount of phase shift differs depending on the frequency of the transmission signals. Normally, transmission signals that have passed through the transmission filter include various frequency components in the pass frequency band of the transmission filter, and therefore the transmission signals include components whose phases have been shifted by various amounts. According to the above configuration, the coupling via the reactance pulls out transmission signals that have been input from the transmission terminal, both before entering the transmission filter and after having passed through the transmission filter, and such transmission signals arrive at the reception terminal. Accordingly, transmission signals that have somewhat different phases are pulled out and arrive at the reception terminal. For this reason, these transmission signals that have somewhat different phases cancel out transmission signals that have passed through the reception filter and the phase shift circuit and arrived at the reception terminal. As a result, transmission signals that have a wider range of phases are cancelled out.

In an embodiment of the present invention, the coupling via the reactance may be capacitive coupling. This enables suppressing performance deterioration and improving isolation in the demultiplexer.

In an embodiment of the present invention, at least a portion of the phase shift circuit may be configured by a lumped constant circuit. By configuring the phase shift circuit with use of a lumped constant circuit, it is possible to realize an improvement in the degree of suppression or improve isolation while keeping the size of the demultiplexer small.

In an embodiment of the present invention, the phase shift circuit having at least a portion configured by a lumped constant circuit may include an inductor and a capacitor, and the inductor may be connected in parallel to a signal line.

In the phase shift circuit, an inductor whose Q is relatively lower than the capacitor is connected in parallel to the signal line, thus suppressing loss deterioration in the demultiplexer due to the addition of the phase shift circuit. This enables realizing an improvement in isolation or an improvement in the degree of suppression of the filter in the demultiplexer while keeping a low loss.

In an embodiment of the present invention, the transmission filter and the reception filter may be stored in a package, and the coupling via the reactance may be formed by wiring of the package. The above configuration realizes an improvement in isolation while keeping the size of the demultiplexer small.

Also included as an embodiment of the present invention is a module including the demultiplexer, the reception filter and the transmission filter of the demultiplexer being mounted on a substrate that the module includes, and the coupling via the reactance being formed by wiring on the substrate. The above configuration enables obtaining a module that includes a demultiplexer having improved isolation while maintaining a small size. Also included as an embodiment of the present invention is a communication device including such a module.

Embodiment 1

FIG. 1 is a diagram depicting a schematic configuration of an antenna demultiplexer according to Embodiment 1. An antenna demultiplexer 10 is configured such that a transmission filter 1 and a reception filter 2 that have mutually different pass frequency bands are connected in parallel to a common terminal Ant. The transmission filter 1 is connected between the common terminal Ant and a transmission terminal Tx. The reception filter 2 and a phase shift circuit 3 are connected in series between the common terminal Ant and a reception terminal Rx. Also, a point on the line from the transmission filter 1 to the common terminal Ant, and a point on the line between the phase shift circuit 3 and the reception terminal Rx are coupled via a capacitor 4.

The antenna demultiplexer 10 is used as the antenna demultiplexer in a wireless communication device typified by, for example, a mobile phone. In this case, the common terminal Ant of the antenna demultiplexer 10 is connected to an antenna of the wireless communication device, the transmission terminal Tx is connected to a transmission circuit that processes transmission signals that have been sent from the antenna, and the reception terminal Rx is connected to a reception circuit that processes reception signals that have been received by the antenna.

Transmission signals that have been input from the transmission circuit to the transmission terminal Tx pass through the transmission filter 1, and are output from the common terminal Ant to the antenna. Also, reception signals that have been input from the antenna to the common terminal Ant pass through the reception filter 2 and the phase shift circuit 3, and are output from the reception terminal Rx to the reception circuit. At this time, since the pass frequency band of the transmission filter 1 (transmission frequency band) and the pass frequency band of the reception filter 2 (reception frequency band) are different, the transmission signals that have passed through the transmission filter 1 flow to the common terminal Ant, without flowing to the reception filter 2.

However, in actuality, a portion of the transmission signals flow to the reception filter 2 and arrive at the reception terminal Rx, thus generating noise. The transmission signals that have leaked to the reception filter 2 in this way arrive at the reception terminal Rx in a phase-shifted condition due to passing through the reception filter 2 and the phase shift circuit 3.

On the other hand, a portion of the transmission signals that have passed through the transmission filter 1 and are bound for the common terminal Ant are pulled out at the point on the line to the common terminal Ant, and such transmission signals pass through the capacitor 4 and arrive at the reception terminal Rx. Accordingly, transmission signals that have passed through the reception filter and the phase shift circuit 3, and transmission signals that have not passed through the reception filter or the phase shift 3 arrive at the reception terminal Rx.

Preferably, the phase shift angle of the phase shift circuit 3 is set such that the phase difference between such transmission signals is approximately 180 degrees. Specifically, the phase shift angle of the phase shift circuit 3 is set such that the phase difference between the phase of the transmission signals that have passed through the reception filter 2 and the phase shift circuit 3 and arrived at the reception terminal Rx, and the phase of transmission signals from the point on the line from the transmission filter 1 to the common terminal Ant (hereinafter, called "the common terminal Ant side") that have passed through the capacitor 4 and arrived at the reception terminal Rx is 180 degrees. Accordingly, the effect in which such transmission signals cancel each other out is large, and the transmission signals that have leaked from transmission filter 1 to the reception filter 2 are fundamentally reduced or eliminated.

The value of the phase shift angle in the phase shift circuit 3 that is appropriate for obtaining such an effect is dependent on the circuit configuration of the antenna demultiplexer 10. For example, in the case in which the reception filter 2 itself has a phase shifting function, the phase of signals that have passed through the reception filter 2 is shifted. For this reason, in the case in which the reception filter 2 and the phase shift circuit 3 are connected between the common terminal Ant and the reception terminal Rx, preferably the phase shift angle of the phase shift circuit 3 is set such that the phase difference between the shift amount obtained by combining the phase shift due to the reception filter 2 and the phase shift due to the phase shift circuit 3, and the shift amount of the transmission signals from the common terminal Ant side that have arrived at the reception terminal Rx via the capacitor 4 is 180 degrees. Note that it is not necessary for the phase difference to be precisely 180 degrees, and the cancellation effect of the transmission signals is obtained as long as the phase difference is in the range of 120 degrees to 240 degrees.

Also, preferably the phase shift angle is determined with consideration given to various other elements besides the phase shifting function of the reception filter 2 and the phase shift circuit 3. For this reason, it is possible to calculate a phase shift angle of the phase shift circuit 3 at which the above phase difference is obtained, with use of, for example, a commercially available circuit simulator after the circuit configuration of the antenna demultiplexer 10 has been determined. Specifically, an optimum phase shift angle can be searched for by using an optimizing function of the circuit simulator. Also, the phase shift angle that is necessary for the phase shift circuit 3 can be calculated by measuring the amount of phase shift due to the reception filter 2 and the capacitor 4 in advance. Note that concrete examples of the circuit configuration of the antenna demultiplexer 10 are described later.

Also, due to the capacitive coupling of the capacitor 4, the power of the transmission signals that have been pulled out from the common terminal Ant side and are sent to the reception terminal Rx is desirably roughly the same as that of the transmission signals that leak into the reception filter 2. The reason for this is, if the power of the transmission signals that are pulled out from the common terminal Ant side and flow to the capacitor 4 is too high, there is the possibility of reducing the original performance of the antenna demultiplexer 10, and if too small, the transmission signals that have arrived at the Rx terminal cannot be cancelled out.

There are cases in which it is difficult to actually implement a capacitor 4 having a small electrostatic capacitance C that enables pulling out such signals whose power is roughly the same as the leaked transmission signals. As one possibility in such a case, FIG. 2 depicts an example of the configuration of coupling between the common terminal Ant side and the reception terminal Rx via a reactance.

Figure 2:
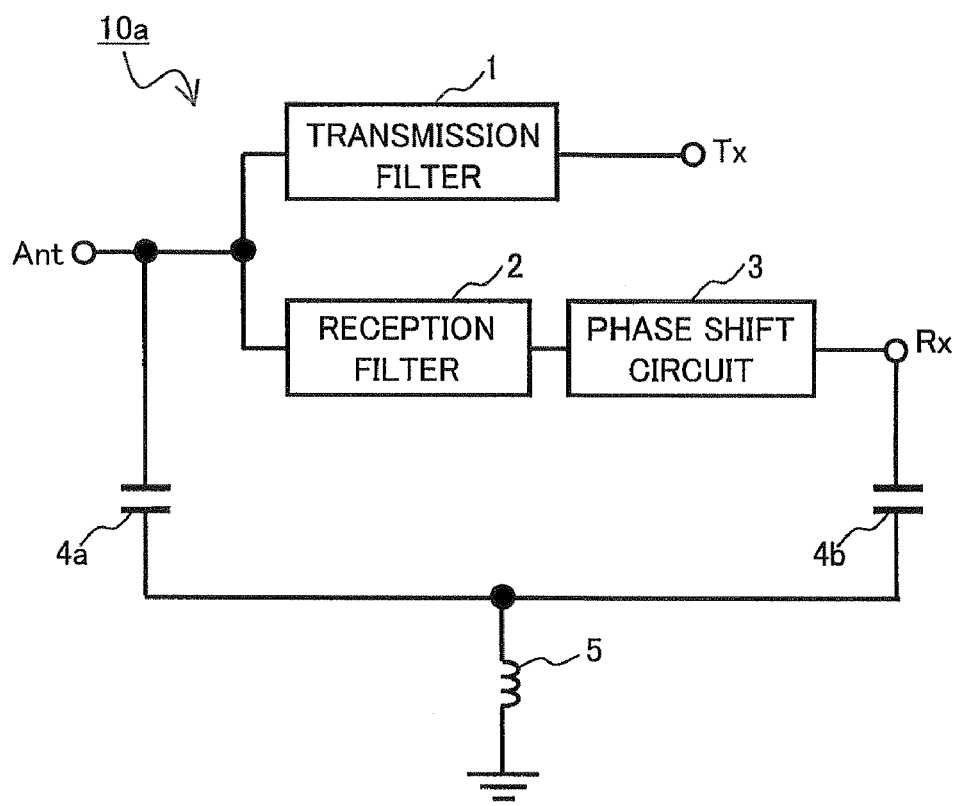
FIG. 2 is a diagram depicting an example of another configuration of coupling between a common terminal side and a reception terminal via a reactance.

In FIG. 2, the common terminal Ant side and the reception terminal Rx are coupled by two capacitors 4a and 4b that are provided in series on the line that couples the common terminal Ant side and the reception terminal Rx, and by a coil 5 that is connected between such line and a ground. When the two capacitors 4a and 4b and the coil 5 are used as depicted in FIG. 2 to obtain roughly the same reactance as the reactance obtained when using only the capacitor 4 depicted in FIG. 1, the electrostatic capacitance C of the capacitors 4a and 4b is higher than the electrostatic capacitance of the capacitor 4. For this reason, in the case in which it is difficult to implement one capacitor 4 having a small electrostatic capacitance C as depicted in FIG. 1, coupling by roughly the same reactance can be realized with use of the capacitors 4a and 4b that have a comparatively high electrostatic capacitance C as depicted in FIG. 2.

Note that although the common terminal Ant side and the reception terminal Rx are coupled via a reactance achieved using the capacitor 4 or a combination of the capacitors 4a and 4b and the coil 5 in the circuit configurations depicted in FIG. 1 and FIG. 2, the position of such coupling via the reactance is not limited to this. It is sufficient for such coupling to be between a position on the line that is on the common terminal Ant side of or the transmission terminal Tx side of the phase shift circuit 3, and a position on the line that is on the reception terminal Rx side of the phase shift circuit 3. For example, the reception terminal Rx and the transmission terminal Tx may be coupled via the capacitor 4 as in an antenna demultiplexer 10b depicted in FIG. 3.

The following describes an exemplary circuit configuration of the phase shift circuit 3 depicted in FIG. 1. FIGS. 4A to 4D are circuit diagrams depicting concrete examples of the phase shift circuit 3. In the phase shift circuit depicted in FIG. 4A, a coil 6 is connected between an input terminal In and an output terminal Out, and the lines on both sides of the coil 6 are grounded via capacitors 7a and 7b. The phase shift circuit depicted in FIG. 4 can be used as, for example, a delayed phase shift type of phase shift circuit that delays the phase of signals that have been input from the input terminal In, and outputs the resulting signals from the output terminal Out.

Figure 4A:
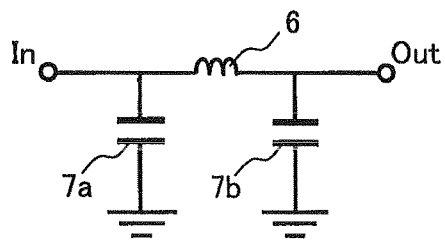
FIG. 4A is a circuit diagram depicting a concrete example of a phase shift circuit 3.
Figure 4B:
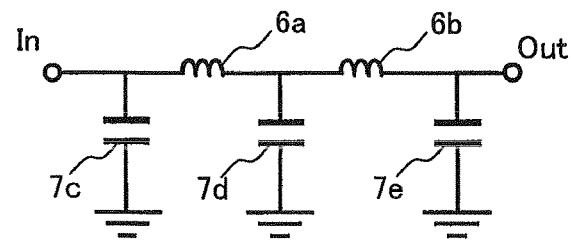
FIG. 4B is a circuit diagram depicting a concrete example of the phase shift circuit 3.

The phase shift circuit depicted in FIG. 4B is configured by connecting two or more of the phase shift circuit depicted in FIG. 4A in a multi-stage cascade, and this phase shift circuit can also be used as a delayed phase shift type of phase shift circuit. In the configuration depicted in FIG. 4B, a plurality of coils 6a and 6b are connected between the input terminal In and the output terminal Out, capacitors 7a, 7b, and 7c are respectively connected to lines between the input terminal In and the coil 6a, between the coil 6a and the coil 6b, and between the coil 6b and the output terminal Out, and the other terminals of the capacitors 7a, 7b, and 7c are grounded. In other words, the coils 6a and 6b are connected in series to the signal line that connects the input terminal In and the output terminal Out, and the capacitors 7a, 7b, and 7c are connected in parallel to the signal line.

The phase shift circuit depicted in FIG. 4A is suitable in the case in which the phase delay (delay phase shift angle) is up to 90 degrees, and the phase shift circuit depicted in FIG. 4B is suitable in the case in which the phase shift delay is 90 degrees or more.

Figure 4C:
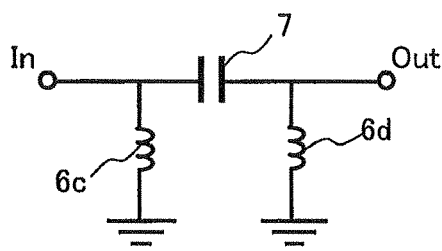
FIG. 4C is a circuit diagram depicting a concrete example of the phase shift circuit 3.
Figure 4D:
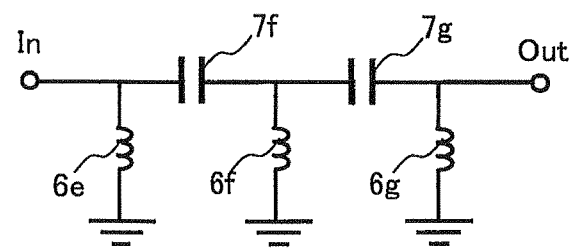
FIG. 4D is a circuit diagram depicting a concrete example of the phase shift circuit 3.

The phase shift circuits depicted in FIG. 4C and FIG. 4D can be used as an advanced phase shift type of phase shift circuit that advances the phase of signals that have been input from the input terminal In, and outputs the resulting signals from the output terminal Out. In the configuration depicted in FIG. 4C, a capacitor 7 is connected to the line that connects the input terminal In and the output terminal Out, and the lines on both sides of the capacitor 7 are grounded by coils 6c and 6d respectively. The configuration depicted in FIG. 4D is a configuration in which two or more of the phase shift circuit depicted in FIG. 4C have been connected in a multi-stage cascade. In the configuration depicted in FIG. 4D, a plurality of capacitors 7f and 7g are connected between the input terminal In and the output terminal Out, and lines between the input terminal In and the capacitor 7f, between the capacitor 7f and the capacitor 7g, and between the capacitor 7g and the output terminal Out are respectively ground by coils 6e, 6f, and 6g. In other words, the capacitors 7f and 7g are connected in series to the signal line that connects the input terminal In and the output terminal Out, and the coils 6e, 6f, and 6g are connected in parallel to the signal line.

The phase shift circuit depicted in FIG. 4C is suitable in the case in which the phase advance (advance phase shift angle) is up to −90 degrees, and the phase shift circuit depicted in FIG. 4D is suitable in the case in which the phase shift advance is −90 degrees or less.

The phase shift circuits depicted in FIGS. 4A to 4D can be configured by, for example, lumped constant elements (capacitors, coils, and the like). In this case, signal loss between the input terminal In and the output terminal Out tends to be lower when capacitors are connected in series to the signal line that connects the input terminal In and the output terminal Out and coils are connected in parallel to the signal line as depicted in FIG. 4C and FIG. 4D, compared to when coils are connected in series to the signal line and capacitors are connected in parallel to the signal line as depicted in FIG. 4A and FIG. 4B. This is because the Q value of coils is lower than that of capacitors.

Note that the specific configuration of the phase shift circuit is not limited to FIGS. 4A to 4D, and other known phase shift circuits may be used. Also, the phase shift circuits depicted in FIGS. 4A to 4D may be configured by lumped constant elements such as coils and capacitors, and also may be configured by a combination of lumped constant elements and distributed constant elements such as striplines and microstriplines. Also, the phase shift circuits depicted in FIGS. 4A to 4D may be configured by chip capacitors and chip coils, and also may be configured by an IPD (Integrated Passive Device).

Figure 5:
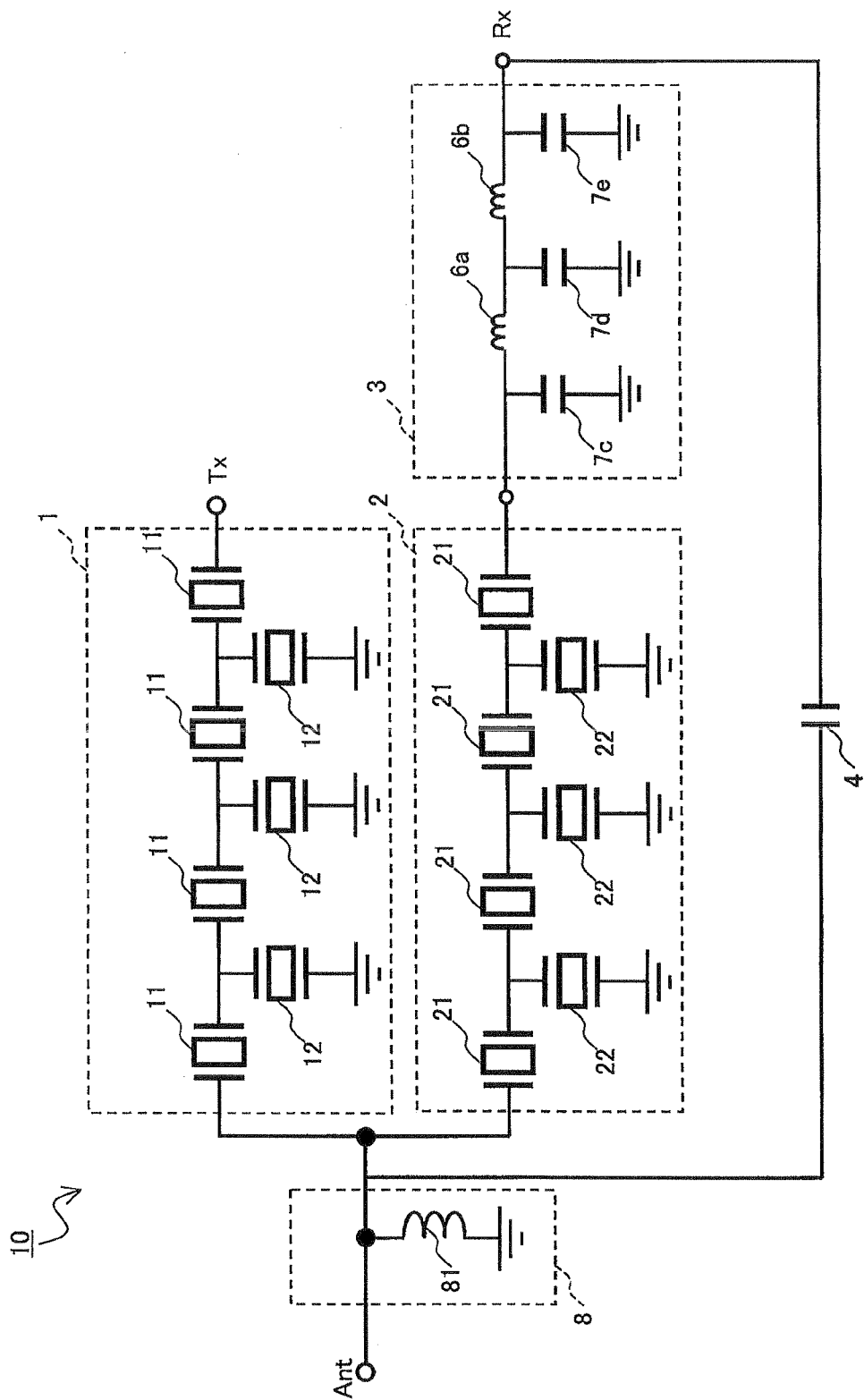
FIG. 5 is a diagram depicting an example of a specific circuit configuration of the antenna demultiplexer depicted in FIG. 1.

The following describes an example of a specific circuit configuration of the antenna demultiplexer 10 depicted in FIG. 1, with reference to FIG. 5. In the example depicted in FIG. 5, the transmission filter 1 of the antenna demultiplexer 10 is configured as a six-stage connection ladder filter. Specifically, the transmission filter 1 includes filters that are connected in multiple stages, and each filter is configured from a series resonator 11 connected to the line (series arm) that connects the common terminal Ant and the transmission terminal Tx, and a parallel resonator 12 connected to the line (parallel arm) that connects the line and a ground. The reception filter 2 is also a six-stage connection ladder filter that is similarly configured by series resonators 21 and parallel resonators 22.

An FBAR (Film Bulk Acoustic wave Resonator), an SMR (Solidly Mounted Resonator), or a SAW (Surface Acoustic Wave) resonator can be used as the series resonators 11 and 21 and the parallel resonators 12 and 22.

Also, a matching circuit 8 is provided on the line on the common terminal Ant side of the transmission filter 1 and the reception filter 2. The matching circuit 8 is configured by a coil 81 that is connected between a ground and a point on the line from the common terminal Ant to the transmission filter 1 and the reception filter 2. Note that the circuit configuration depicted in FIG. 4B has been employed as the configuration of the phase shift circuit 3.

If, for example, a W-CDMA method (Band I) mobile phone is assumed to be the application of the antenna demultiplexer 10 depicted in FIG. 5, the transmission frequency band is 1920 to 1980 MHz, and the reception frequency band is 2110 to 2170 MHz. The following describes frequency characteristics of the antenna demultiplexer 10 in the case in which the resonance frequencies of the resonators 11, 12, 21, and 22 in the transmission filter 1 and the reception filter 2 have been set so as to achieve the above frequency bands.

Figure 6A:
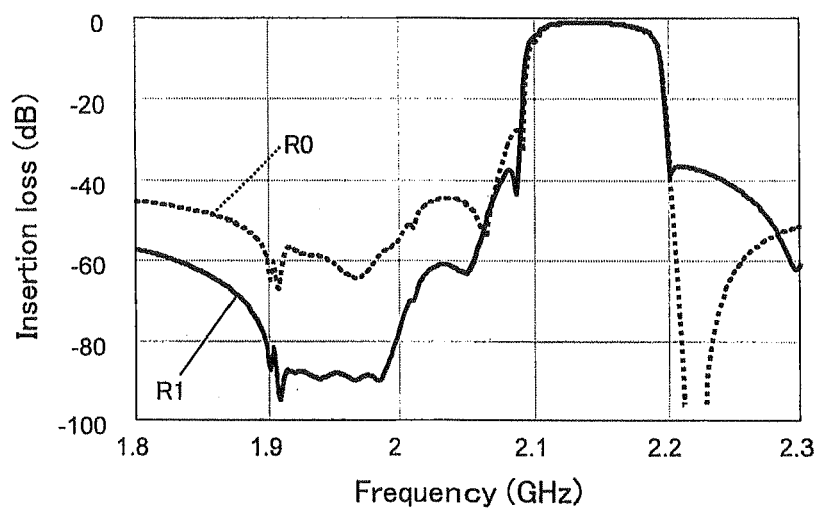
FIG. 6A is a diagram depicting frequency characteristics of reception filters in antenna demultiplexers.
Figure 6B:
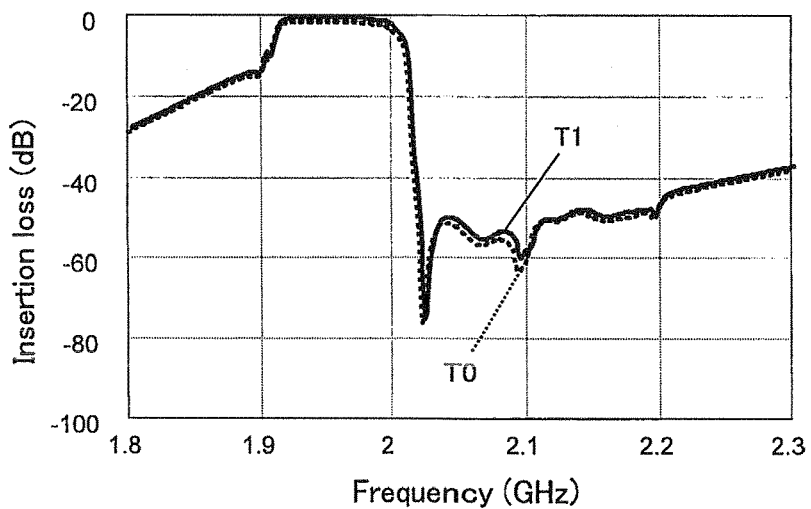
FIG. 6B is a diagram depicting frequency characteristics of transmission filters in antenna demultiplexers.
Figure 7:
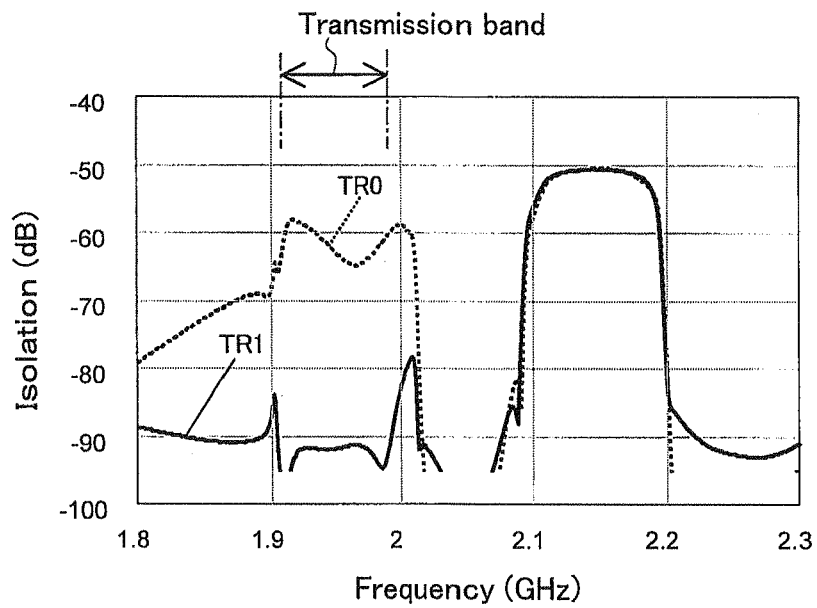
FIG. 7 is a graph depicting isolation between transmission terminals and reception terminals of antenna demultiplexers in Embodiment 1.

FIG. 6A and FIG. 6B are diagrams depicting the frequency characteristics of the antenna demultiplexer 10 in the case in which, for example, the value of the capacitor 4 is 15 fF, and the phase shift angle of the phase shift circuit is 191 degrees. In the graphs depicted in FIG. 6A and FIG. 6B, the vertical axis indicates insertion loss, and the horizontal axis indicates frequency. Also, FIG. 7 is a graph depicting isolation, which indicates the degree to which transmission signals that have been input from the transmission terminal Tx, leaked to the reception filter 2 side, and arrived at the reception terminal Rx can be suppressed in the antenna demultiplexer 10. The frequency characteristics depicted in FIG. 6A and FIG. 6B and the isolation depicted in FIG. 7 were obtained using a circuit simulator.

FIG. 6A is a graph depicting frequency characteristics R1 of the reception filter 2 in the antenna demultiplexer 10. FIG. 6B is a graph depicting frequency characteristics T1 of the transmission filter 1 in the antenna demultiplexer 10. In the graphs depicted in FIG. 6A and FIG. 6B, dotted lines indicate reception filter frequency characteristics R0 and transmission filter frequency characteristics T0 of an antenna demultiplexer having a conventional configuration (hereinafter, called the conventional antenna demultiplexer), which is the circuit configuration depicted in FIG. 5 from which the capacitive coupling obtained using the phase shift circuit 3 and the capacitor 4 has been removed.

As depicted in FIG. 6B, the frequency characteristics T1 of the transmission filter 1 are substantially the same as the transmission filter frequency characteristics T0 of the conventional antenna demultiplexer. In contrast, with the frequency characteristics R1 of the reception filter 2 depicted in FIG. 6A, insertion loss in the non-pass frequency band is lower than with the reception filter in the conventional antenna demultiplexer. As depicted in FIG. 7, particularly in the transmission frequency band (1920 to 1980 MHz), an isolation TR1 has thus been improved greater than or equal to approximately 25 dB in comparison to an isolation TR0 of the conventional antenna demultiplexer. Note that isolation indicated in FIG. 7 is a value X (in units of dB) that is calculated as depicted in the below Expression 1, with use of a power A of a transmission signal that has been input to the transmission terminal Tx and a power B of a transmission signal that has leaked to the reception filter 2 side and arrived at the reception terminal Rx.

$$X=(10)\times\log(B/A) \quad \text{(Expression 1)}$$

Embodiment 2

Figure 8:
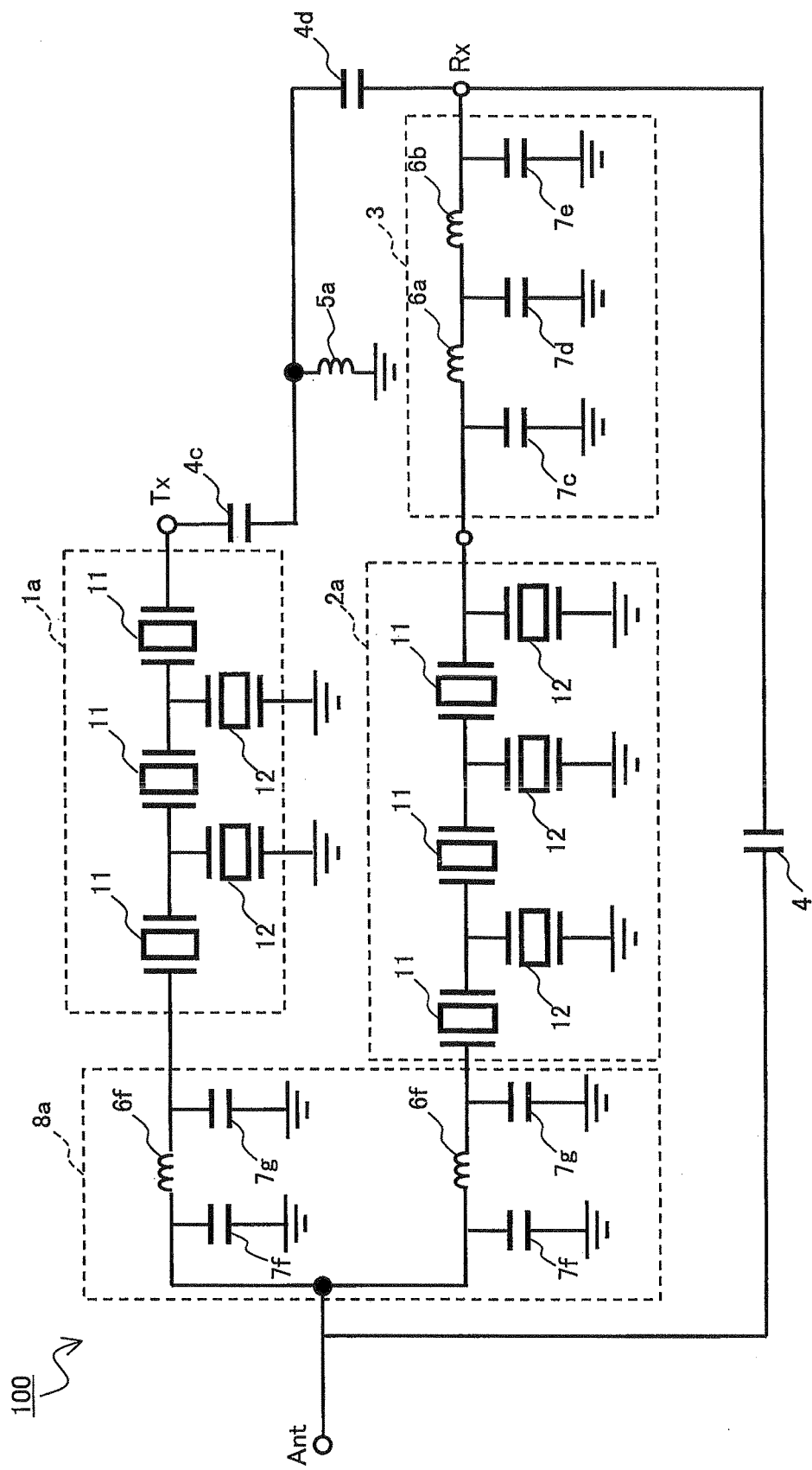
FIG. 8 is a diagram depicting a circuit configuration of an antenna demultiplexer.

Embodiment 2 is an example of a variation of the circuit configuration of the antenna demultiplexer 10 according to Embodiment 1. FIG. 8 is a diagram depicting a circuit configuration of an antenna demultiplexer 100 according to the present embodiment. In FIG. 8, the same numbers have been given to portions that are the same as in FIG. 5.

In the antenna demultiplexer 100 depicted in FIG. 8, a transmission filter 1a is a four-stage connection ladder filter, and a reception filter 2a is a five-stage connection ladder filter. A matching circuit 8a is configured by coils 6f that are respectively connected in series to lines in the transmission filter 1a and the reception filter 2a, and capacitors 7f and 7g that are arranged between the lines and grounds.

In the antenna demultiplexer 100 depicted in FIG. 8, the common terminal Ant and the reception terminal Rx are coupled via a capacitor 4. Furthermore, the transmission terminal Tx and the reception terminal Rx are coupled by a circuit that includes a capacitor 4c, a capacitor 4d, and a coil 5a. This circuit has a configuration in which the two capacitors 4c and 4d are connected in series to the line that connects the transmission terminal Tx and the reception terminal Rx, and the coil 5a is arranged between a ground and a line that connects the capacitors 4c and 4d.

Accordingly, in the antenna demultiplexer 100, transmission signals are pulled out from the transmission terminal Tx and the common terminal Ant, and arrive at the reception terminal Rx. For this reason, transmission signals that have been pulled out from both the transmission terminal Tx and the common terminal Ant cancel out transmission signals that have leaked into the reception filter 2a, passed through the phase shift circuit 3, and arrived at the reception terminal Rx. The phase of the transmission signals that have been pulled out from the common terminal Ant after having passed through the transmission filter 1a is somewhat shifted with respect to the transmission signals that have been pulled out from the transmission terminal Tx. For this reason, the transmission signals that include two somewhat shifted phases cancel out the transmission signals that have leaked into the reception filter 2a. As a result, transmission signals that have a wider range of phases are cancelled out.

For example, there are cases in which the phase of transmission signals that have leaked from the transmission filter 1a to the reception filter 2a side becomes shifted while passing through the transmission filter 1a, the matching circuit 8a, and the reception filter 2a. The shift amount tends to differ depending on the transmission signal frequency. For this reason, there are cases in which transmission signals that have leaked into the reception filter 2a arrive at the reception terminal Rx in a condition of including phase components that are shifted by various shift amounts. Such leaked transmission signals and transmission signals that have been pulled out from both the transmission terminal Tx and the common terminal Ant cancel each other out, and therefore transmission signals that have a wider range of phases are cancelled out. For this reason, by appropriately setting the phase shift angle of the phase shift circuit in the circuit configuration depicted in FIG. 8, it is possible to, for example, cancel out leaked transmission signals in the entire transmission frequency band.

Figure 9A:
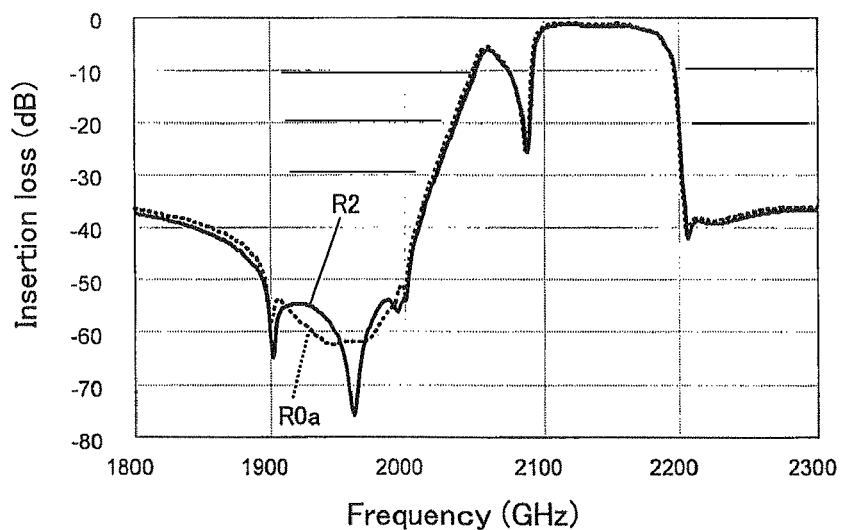
FIG. 9A is a diagram depicting an example of frequency characteristics of antenna demultiplexers in Embodiment 2.
Figure 9B:
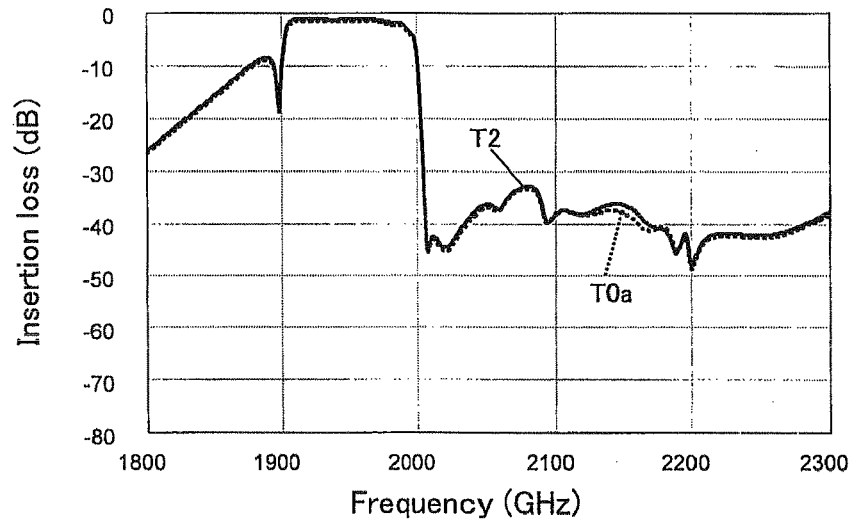
FIG. 9B is a diagram depicting an example of frequency characteristics of antenna demultiplexers in Embodiment 2.
Figure 10:
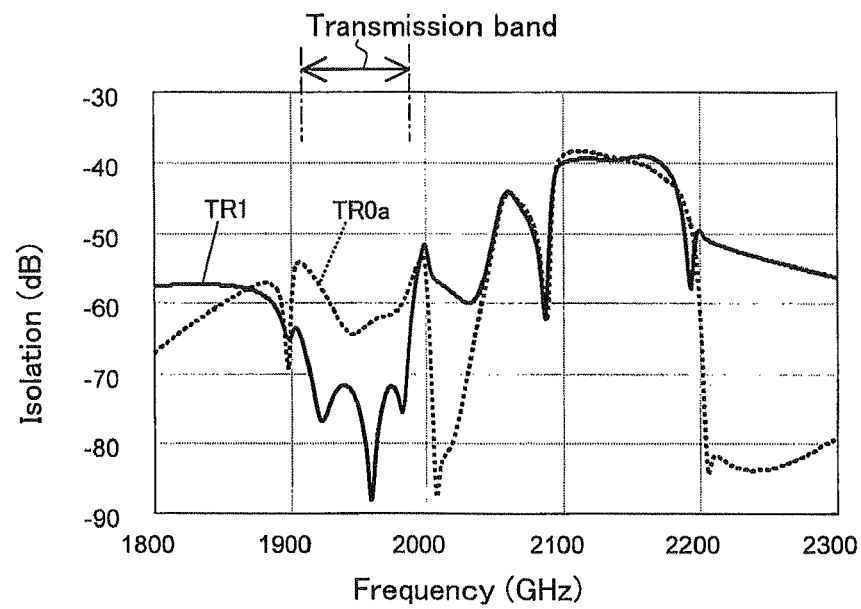
FIG. 10 is a graph depicting isolation between transmission terminals and reception terminals of antenna demultiplexers in Embodiment 2.

FIG. 9A and FIG. 9B are diagrams depicting frequency characteristics of the antenna demultiplexer 100, in the case in which, as one example, the transmission frequency band of the antenna demultiplexer 100 is 1920 to 1980 MHz, the reception frequency band is 2110 to 2170 MHz, the electrostatic capacitance of the capacitor 4c and the capacitor 4d is 0.37 pF, the electrostatic capacitance of the capacitor 4 is 0.8 fF, the inductance of the coil 5a is 0.14 nH, and the phase shift angle of the phase shift circuit is 158 degrees. In the graphs depicted in FIGS. 9A and 9B, the vertical axis indicates insertion loss, and the horizontal axis indicates frequency. Also, FIG. 10 is a graph depicting isolation between the transmission terminal Tx and the reception terminal Rx in the antenna demultiplexer 100. The frequency characteristics depicted in FIG. 9A and FIG. 9B and the isolation depicted in FIG. 10 were obtained using a circuit simulator.

FIG. 9A is a graph depicting frequency characteristics R2 of the reception filter 2a in the antenna demultiplexer 100. FIG. 9B is a graph depicting frequency characteristics T2 of the transmission filter 2b in the antenna demultiplexer 100. In the graphs depicted in FIG. 9A and FIG. 9B, dotted lines indicate reception filter frequency characteristics R0a and transmission filter frequency characteristics T0a of an antenna demultiplexer having a configuration that is the circuit configuration depicted in FIG. 8 from which the capacitive coupling between the common terminal Ant and the reception terminal Rx obtained using the phase shift circuit 3 and the capacitor 4 has been removed, and the coupling between the transmission terminal Tx and the reception terminal Rx has been removed, that is to say, a conventional configuration.

As depicted in FIG. 9B, the frequency characteristics T2 of the transmission filter 1a are substantially the same as the transmission filter frequency characteristics T0a of the conventional antenna demultiplexer. In contrast, with the frequency characteristics R2 of the reception filter 2a depicted in FIG. 9A, insertion loss in the transmission frequency band (1920 to 1980 MHz) is lower than with the reception filter in the conventional antenna demultiplexer. Furthermore, as depicted in FIG. 10, the isolation TR1 in the transmission frequency band (1920 to 1980 MHz) has been improved greater than or equal to approximately 10 dB in comparison to an isolation TR0a of the conventional antenna demultiplexer.

Although embodiments of the present invention have been described above, the range in which the present invention is applicable is not limited to the above embodiments. For example, likewise effects can be obtained even when using a dielectric filter as the reception filter and/or the transmission filter of the antenna demultiplexer. Also, the capacitor 4 used in the capacitive coupling in Embodiment 1, and the capacitors 4, 4c, and 4d and the coil 5a in Embodiment 2 can be configured with use of an IPD.

Also, although examples in which the phase shift circuit 3 is provided on the line on the reception terminal Rx side of the reception filters 2 and 2a are described in the above embodiments, the position of the phase shift circuit 3 is not limited to this. For example, the phase shift circuit may be provided on the common terminal Ant side of the reception terminal Rx, or as part of the matching circuit 8 or 8a.

Also, as examples of coupling via a reactance, the coupling between the common terminal Ant side and the reception terminal Rx is described in Embodiment 1, and a combination of the coupling between the common terminal Ant and the reception terminal Rx and the coupling between the transmission terminal Tx and the reception terminal Rx is described in Embodiment 2, but the coupling position is not limited to this. It is sufficient for such coupling to be between the line on the common terminal Ant side of or the transmission terminal Tx side of the phase shift circuit 3, and the line on the reception terminal Rx side of the phase shift circuit 3.

Also, in the case in which, for example, the antenna demultiplexer is configured such that the transmission filter and the reception filter are stored in a package, at least a portion of the capacitors 4, and 4a to 4d and the coils 5 and 5a used in the above coupling between the common terminal Ant and the reception terminal Rx and between the transmission terminal Tx and the reception terminal Rx can be included in the package.

Figure 3:
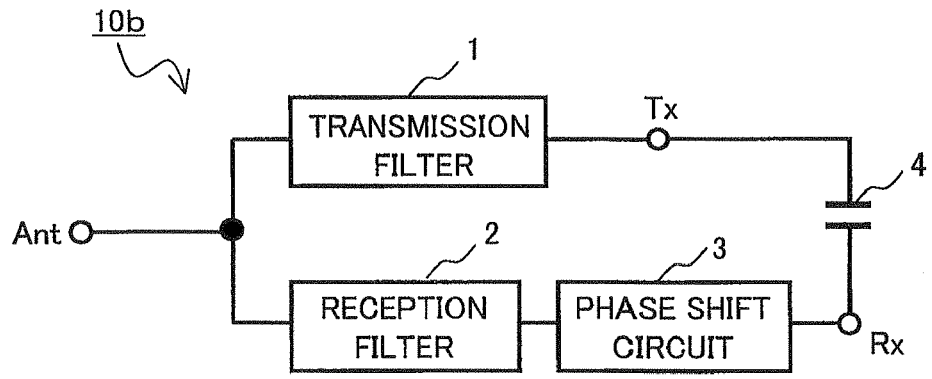
FIG. 3 is a diagram depicting a variation of the schematic configuration of the antenna demultiplexer according to Embodiment 1.
Figure 11:
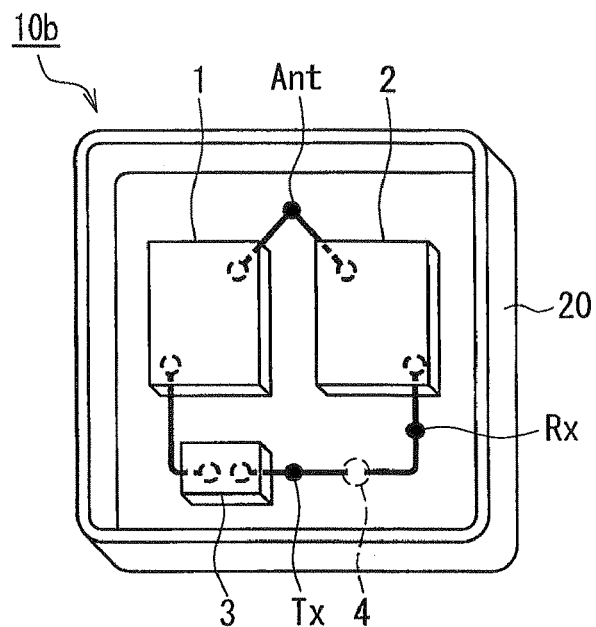
FIG. 11 is a diagram depicting a schematic structure of an antenna demultiplexer configured using a package.

FIG. 11 is a diagram depicting a schematic configuration of an antenna demultiplexer configured by a package in which the transmission filter and the reception filter are stored. The antenna demultiplexer 10b depicted in FIG. 11 is configured by packaging the antenna demultiplexer 10b whose circuit configuration is depicted in FIG. 3. Portions of the constituent elements depicted in FIG. 11 that correspond to constituent elements of the circuit depicted in FIG. 3 have been given the same numbers.

As depicted in FIG. 11, the transmission filter 1, the reception filter 2, and the phase shift circuit 3 are provided on a bottom face of a package 20. Also, a wiring pattern has been formed on the bottom face of the package 20. The connection between the common terminal Ant and the transmission filter 1 and the reception filter 2, the connection between the transmission filter 1 and the transmission terminal Tx, and the connection between the reception filter 2 and the reception terminal Rx via the phase shift circuit 3 are realized by this wiring pattern. Furthermore, the coupling (capacitive coupling) between the transmission terminal Tx and the reception terminal Rx via the capacitor 4 is also formed by the wiring pattern on the bottom face of the package. Note that this capacitive coupling is not limited to the case of being formed by the wiring pattern on the bottom face of the package, but instead this capacitive coupling may be formed by, for example, wires and a lumped constant capacitor whose structure includes a dielectric sandwiched between a top electrode and a bottom electrode.

Also, a communication device that includes the antenna demultiplexer 10, 10a, 10b, or 100 described in the above embodiments is also included as an embodiment of the present invention.

Figure 12:
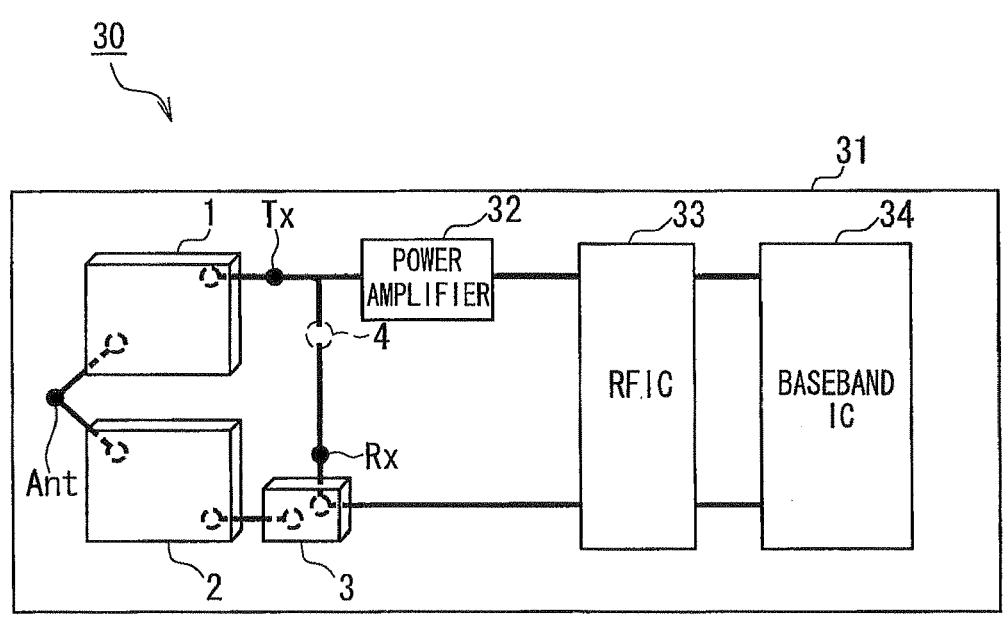
FIG. 12 is a diagram depicting a schematic configuration of a communication device including the antenna demultiplexer whose circuit configuration is depicted in FIG. 3.

FIG. 12 is a diagram depicting a schematic configuration of a communication device 30 including the antenna demultiplexer 10b whose circuit configuration is depicted in FIG. 3. Portions of the constituent elements depicted in FIG. 12 that correspond to constituent elements of the circuit depicted in FIG. 3 have been given the same numbers. In the communication device 30 depicted in FIG. 12, the transmission filter 1, the reception filter 2, the phase shift circuit 3, a power amplifier 32, an RFIC 33, and a baseband IC are provided on a module substrate 31.

The connection between the common terminal Ant and the transmission filter 1 and the reception filter 2, the connection between the transmission filter 1 and the transmission terminal Tx via the phase shift circuit 3, and the connection between the reception filter 2 and the reception terminal Rx are realized by a wiring pattern formed in the module substrate 31. Furthermore, the coupling (capacitive coupling) between the transmission terminal Tx and the reception terminal Rx via the capacitor 4 is also formed by the wiring pattern on the bottom face of the package. Note that the common terminal Ant is connected to an antenna (not depicted) included in the communication device 30.

The transmission terminal Tx is connected to the RFIC 33 via the power amplifier 32, and the reception terminal Rx is also connected to the RFIC 33. The RFIC 33 is connected to a baseband IC 34. The RFIC 33 is configured by a semiconductor chip and other parts. Integrated in the RFIC 33 are circuits including a reception circuit for processing reception signals that have been input from the reception terminal, and a transmission circuit for processing transmission signals that have been output to the common terminal Ant via the power amplifier 32. Note that the power amplifier 32 is a circuit that amplifies transmission signals that have been output from the transmission circuit of the RFIC 33 and outputs the amplified transmission signals to the transmission terminal Tx of the transmission filter 1.

Also, the baseband IC 34 is also configured by a semiconductor chip and other parts. Integrated in the baseband IC 34 are a circuit for converting reception signals that have been received from the reception circuit included in the RFIC 33 into audio signals and packet data, and a circuit for converting audio signals and packet data into transmission signals and outputting such transmission signals to the transmission circuit included in the RFIC 33.

Although not depicted, the baseband IC 34 is connected to an output device such as a speaker and a display, and the audio signals and packet data that has been converted from the reception signals by the baseband IC 34 can be output and made recognizable to a user of the communication device 30. Also, the baseband IC 34 is connected to input devices that the communication device 30 includes, such as a microphone and buttons, and the configuration is such that the baseband IC 34 can convert audio and data that has been input from the user into transmission signals.

Note that the configuration of the communication device 30 is not limited to the example depicted in FIG. 12. Also, a module that is an assemblage of parts used in a portion of the communication device 30 and that includes the antenna demultiplexer 10, 10a, 10b, or 100 of the above embodiments is also included as an embodiment of the present invention.

Figure 13:
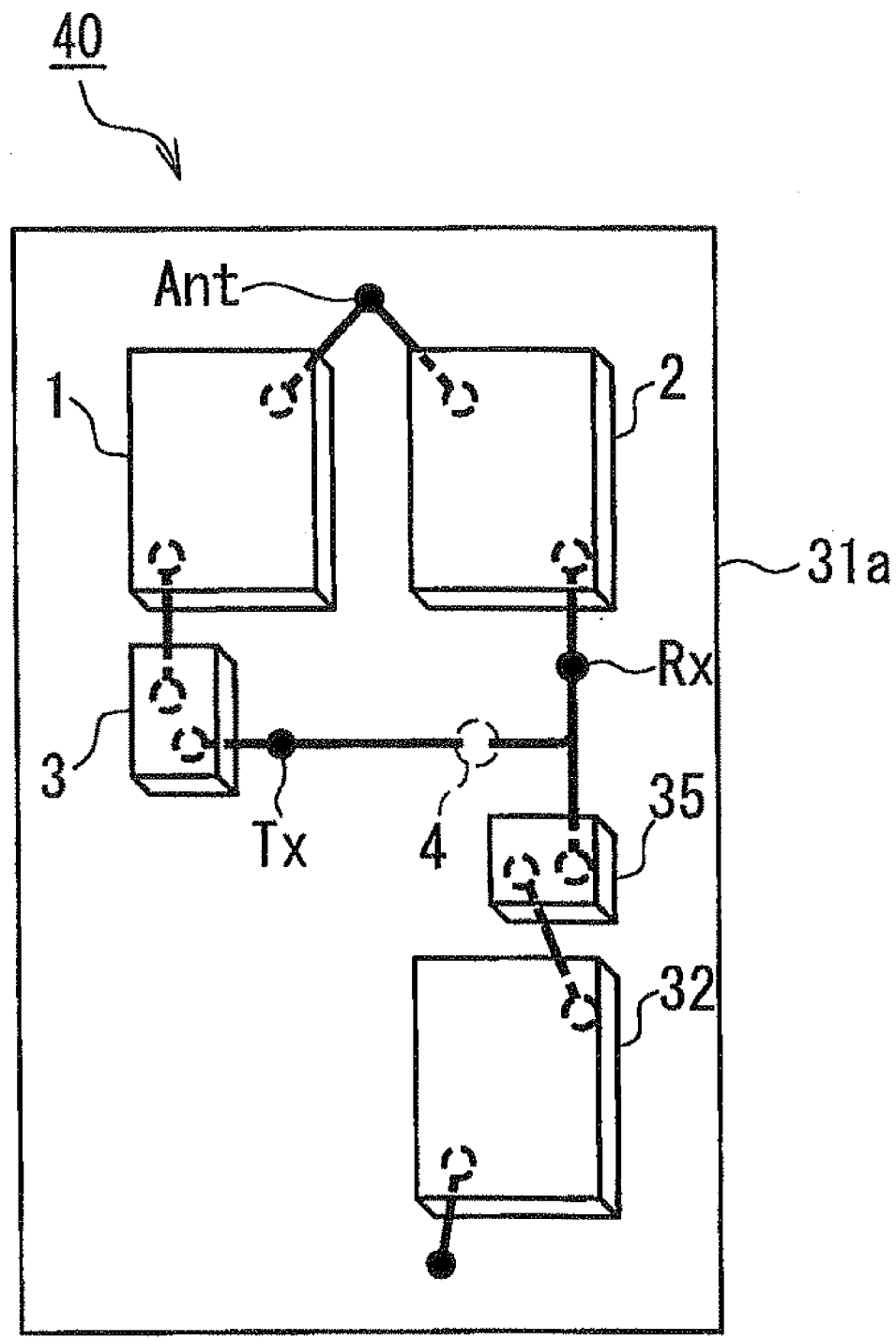
FIG. 13 is a diagram depicting an example of a module including the antenna demultiplexer whose circuit configuration is depicted in FIG. 3.
Figure 14:
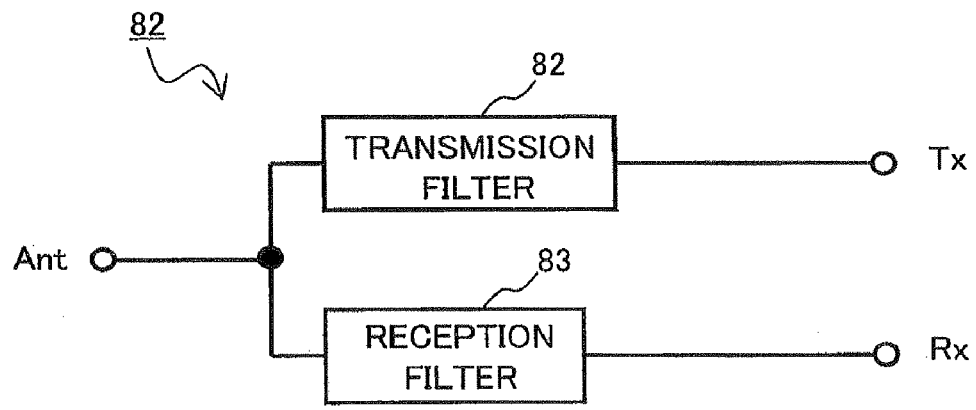
FIG. 14 is a diagram depicting a configuration of a conventional demultiplexer.

FIG. 13 is a diagram depicting an example of a module including the antenna demultiplexer 10b whose circuit configuration is depicted in FIG. 3. In the example depicted in FIG. 13, the transmission filter 1, the reception filter 2, the phase shift circuit 3, a matching circuit 35, and the power amplifier 32 are provided on a module substrate 31a. The connection relationships between the common terminal Ant, the transmission filter 1, the reception filter 2, the phase shift circuit 3, the capacitor 4, the reception terminal Rx, and the transmission terminal Tx are the same as the those in the communication device depicted in FIG. 12. The transmission terminal Tx is connected to the power amplifier 32 via the matching circuit 35. Note that which parts or circuits are included in the one module is arbitrary, and there is no limitation to the example depicted in FIG. 13.

As depicted in the antenna demultiplexers 10, 10a, 10b, and 100 of the above embodiments, according to the present invention, the effect of significantly improving isolation is obtained by cancelling out transmission signals that have leaked into the reception circuit with use of separate transmission signals that have arrived from within the antenna demultiplexer. Furthermore, it is possible to provide a high-performance antenna demultiplexer in which isolation has been improved while maintaining a small size and low loss.

The present invention is useful as an antenna demultiplexer having improved isolation, and a communication device and module using the same.

Embodiment 3

Configuration of Present Embodiment

Figure 15:
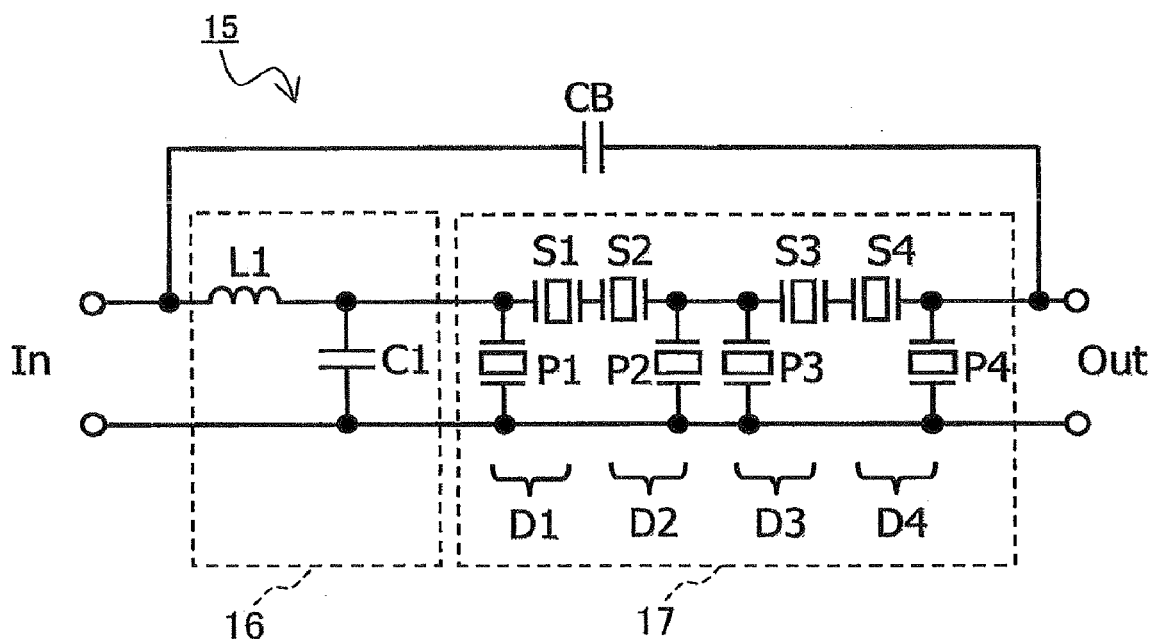
FIG. 15 is a circuit configuration diagram of a filter in Embodiment 3.

FIG. 15 is a circuit configuration diagram of a filter in Embodiment 3. In a filter 15 depicted in FIG. 15, a phase shift circuit 16 and a filter unit 17 are connected between an input terminal In and an output terminal Out. Also, the filter 15 is provided with a bridging capacitance CB that connects a node between the input terminal In and the phase shift circuit 16, and a node between the filter unit 17 and the output terminal Out, by bridging.

The phase shift circuit 16 includes a coil L1 connected in series, and a capacitor C1 connected in parallel. The filter unit 17 is a ladder filter configured by filter elements D1 to D4 that are connected in four stages. The filter elements D1 to D4 respectively include one of series resonators S1 to S4 and one of parallel resonators P1 to P4.

Principle of Present Embodiment

Configuring a filter as the filter 15 enables improving the degree of suppression in the suppression band, and enables obtaining favorable filter characteristics. The following describes the principle of this.

Figure 16A:
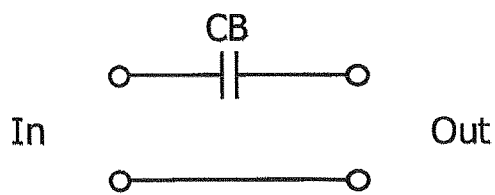
FIG. 16A is a diagram depicting a circuit configuration of a capacitance CB.
Figure 16B:
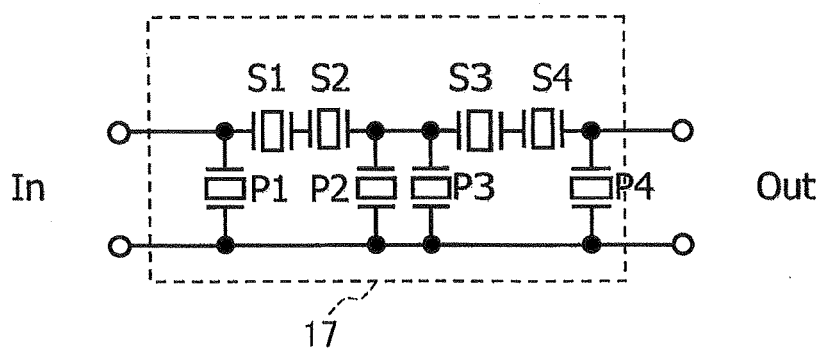
FIG. 16B is a diagram depicting a circuit configuration of a filter unit (ladder filter).
Figure 16C:
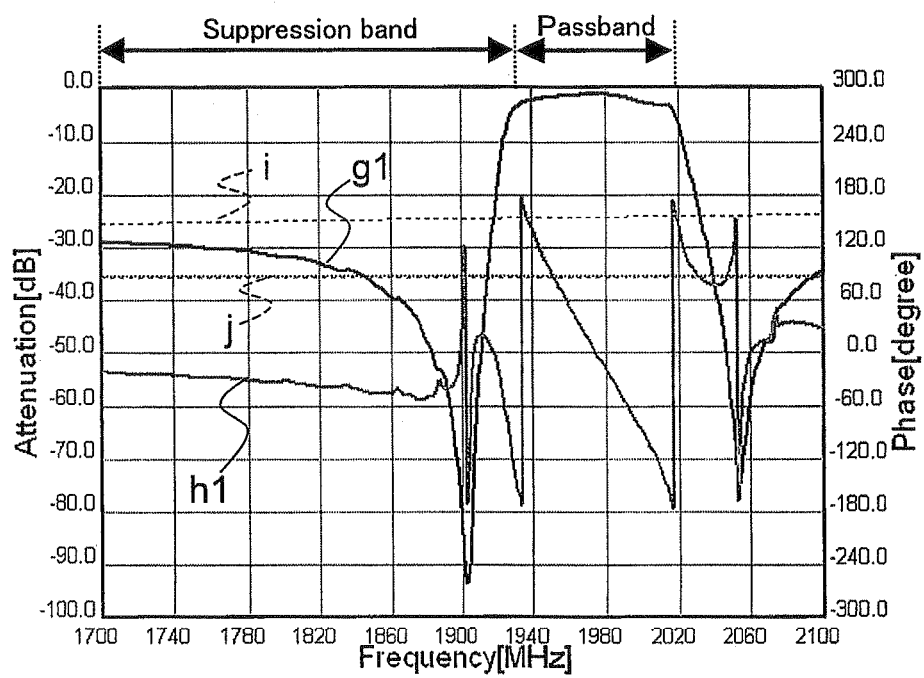
FIG. 16C is a graph depicting pass characteristics and phase characteristics of the capacitance CB in FIG. 16A and the filter unit in FIG. 16B.

FIG. 16A is a diagram depicting a circuit configuration in the case in which the capacitance CB is connected in series between the input terminal In and the output terminal Out. FIG. 16B is a diagram depicting a circuit configuration in the case in which the filter unit 17 (ladder filter) is connected in series between the input terminal In and the output terminal Out. FIG. 16C is a graph depicting pass characteristics and phase characteristics of the capacitance CB depicted in FIG. 16A, and pass characteristics and phase characteristics of the filter unit depicted in FIG. 16B.

In the graph depicted in FIG. 16C, the scale of the horizontal axis expresses frequency, the scale of the vertical axis on the left side expresses attenuation [dB], and the scale of the vertical axis on the right side expresses phase [°]. In FIG. 16C, a solid line g1 indicates the pass characteristics of the filter unit 17 depicted in FIG. 16B, and a solid line h1 indicates the phase characteristics of the filter unit 17. A dashed line i indicates the pass characteristics of the capacitance CB depicted in FIG. 16A, and a dashed line j indicates the phase characteristics of the capacitance CB. In the example depicted in FIG. 16C, when focus is placed on the suppression band on the passband low frequency side (approximately 1700 MHz to approximately 1920 MHz), it can be seen that the phase of the filter unit 17 is approximately −20° to −50°. On the other hand, the phase of the capacitance CB is approximately 85°.

Figure 17A:
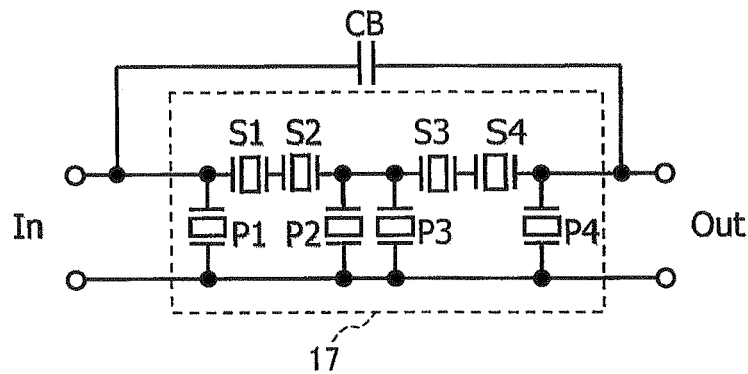
FIG. 17A is a diagram depicting a configuration of a circuit in which the capacitance CB in FIG. 16A bridges to a filter unit 17 in FIG. 16B.

FIG. 17A is a diagram depicting a circuit configuration in the case in which the capacitance CB in FIG. 16A bridges between the input terminal In and the output terminal Out of the filter unit 17 in FIG. 16B. Specifically, FIG. 17A depicts a circuit configuration in which the bridging capacitance CB has an electrostatic capacitance of 0.05 pF and has been added between the input and output terminals of the ladder filter.

Figure 17B:
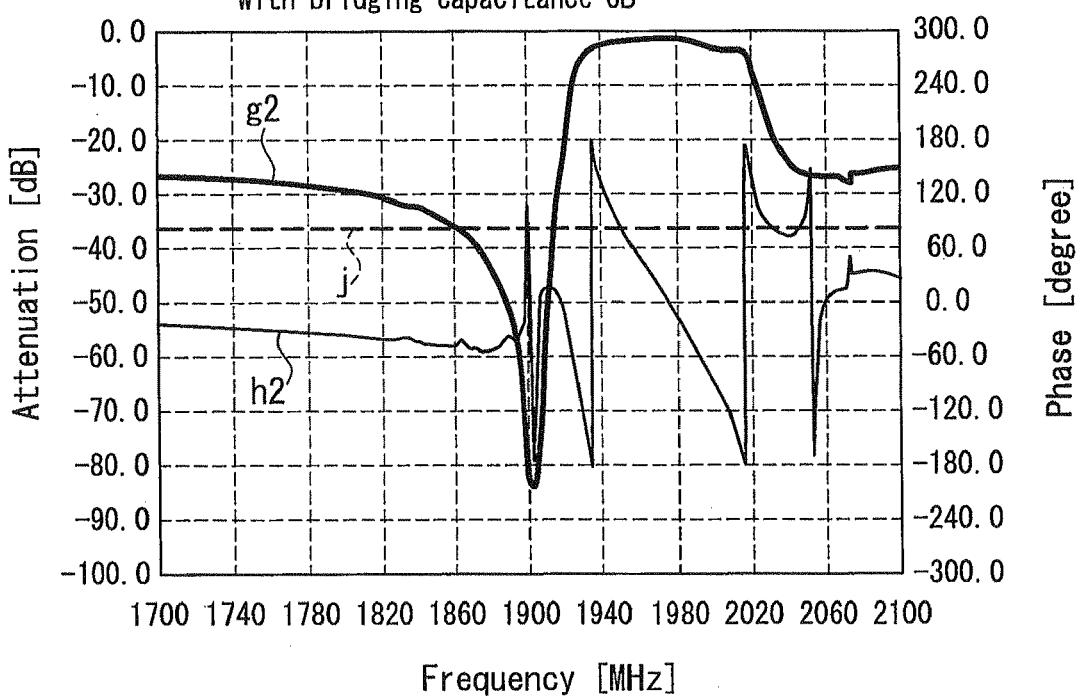
FIG. 17B is a graph depicting pass characteristics and phase characteristics of the circuit depicted in FIG. 17A.

FIG. 17B is a graph depicting pass characteristics and phase characteristics of the circuit depicted in FIG. 17A. In FIG. 17B, a solid line g2 indicates pass characteristics, and a solid line h2 indicates phase characteristics. For reference, the phase characteristics of the capacitance CB in FIG. 16A is also indicated by the dashed line j. In FIG. 17B, the phase difference between a current that has passed through the bridging capacitance CB and a current that has passed through the filter unit 17 is approximately 105° to 135° in the suppression band on the passband low frequency side.

Here, if this phase difference in the suppression band is set to 180°, it is to be expected that the current from the bridging capacitance CB and the current from the filter unit 17 will cancel each other out, and the degree of suppression in the suppression band will be improved. In view of this, consider changing the phase of the current that passes through the filter unit 17 so as to be the antiphase of the phase of the current that passes through the bridging capacitance CB.

Figure 18A:
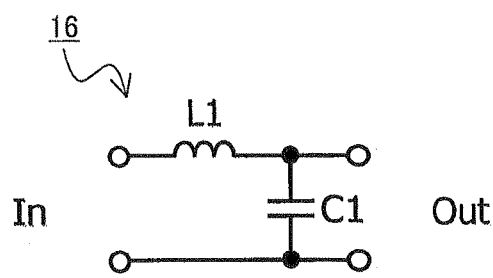
FIG. 18A is a diagram depicting a configuration of a phase shift circuit.
Figure 18B:
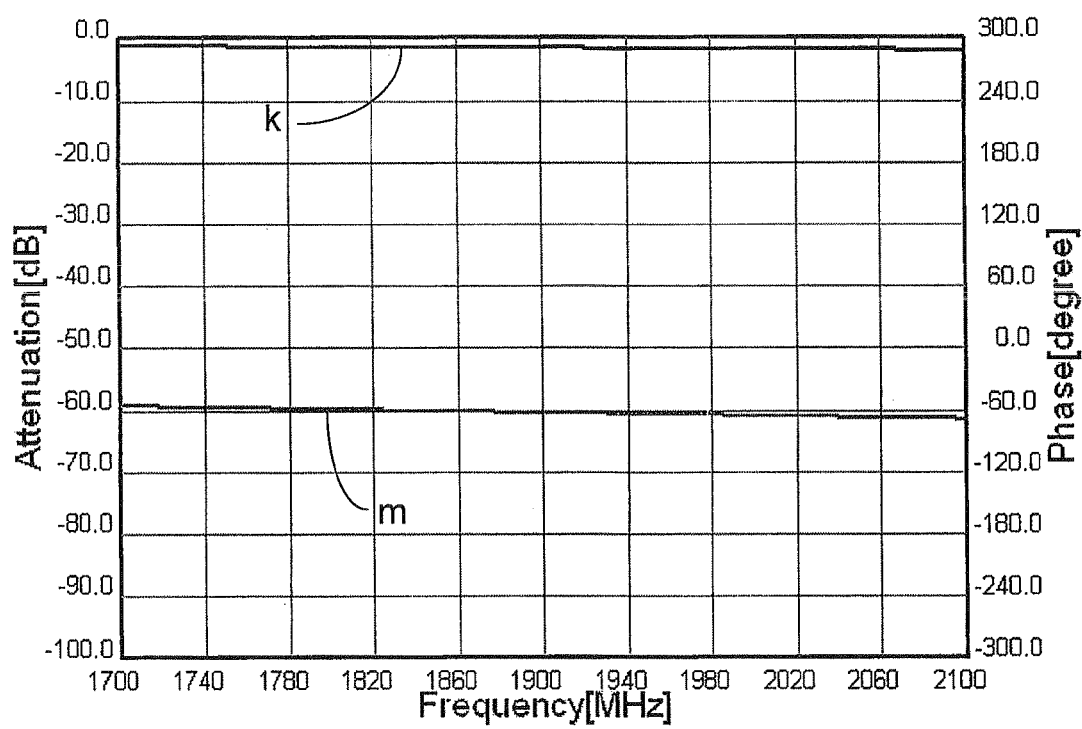
FIG. 18B is a diagram depicting pass characteristics and phase characteristics of the phase shift circuit in FIG. 18A.

For example, the output phase can be changed if the phase shift circuit (phase delay circuit) 16 such as is depicted in FIG. 18A is connected to the filter unit 17. The phase shift circuit 16 includes the coil L1 (series inductor) that is connected in series between the input terminal In and the output terminal Out, and the capacitor C1 (parallel capacitor) that is connected in parallel. Here, FIG. 18B is a graph depicting pass characteristics (solid line k) and phase characteristics (solid line m) of the phase shift circuit 16 in the case in which the inductance of the coil L1 is 5.74 nH, and the electrostatic capacitance of the capacitor C1 is 1.15 pF. The phase characteristic is approximately −60°. If this phase shift circuit 16 is connected to the filter unit 17, it can be expected that the phase of the current passing through the filter unit 17 will be changed by approximately −60°.

Figure 19A:
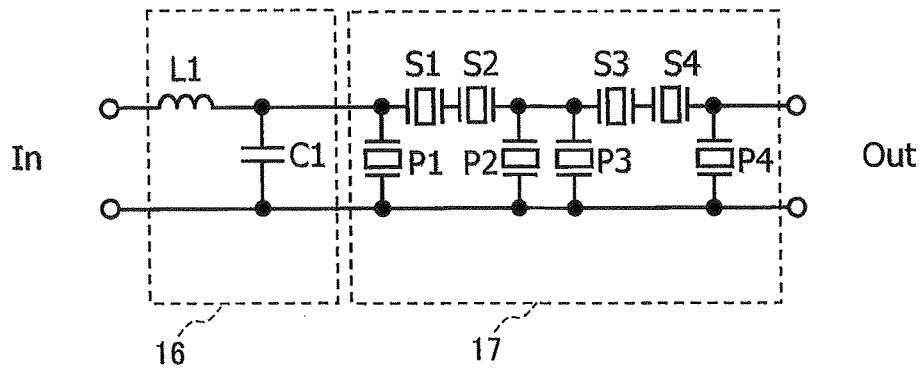
FIG. 19A is a diagram depicting a configuration of a circuit in which a phase shift circuit has been added to the input side of a filter unit.
Figure 19B:
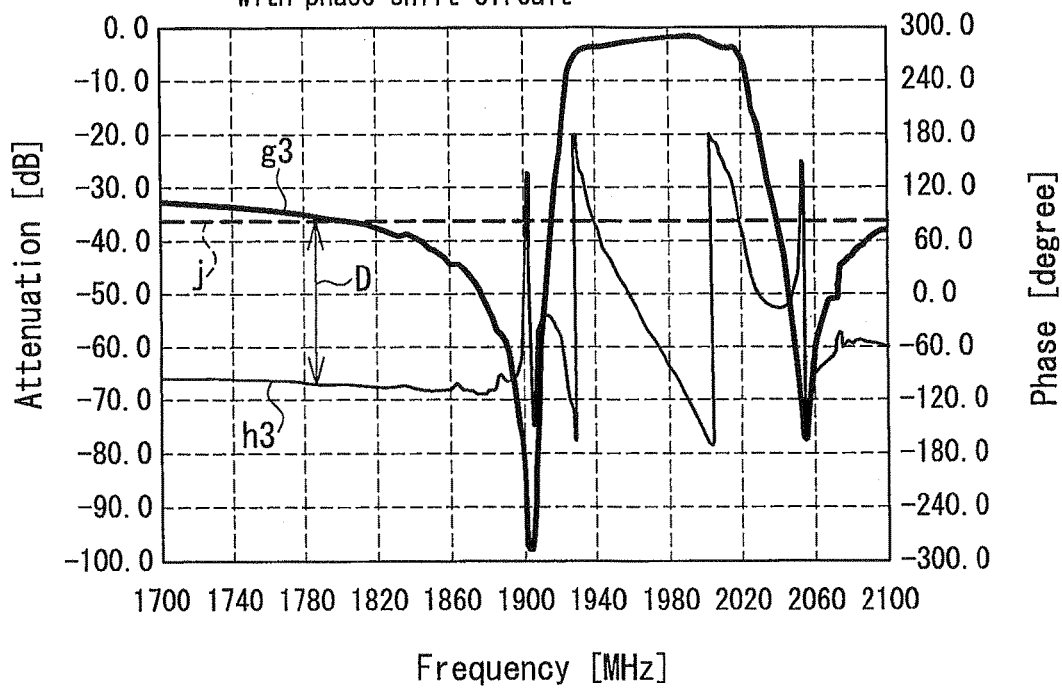
FIG. 19B is a graph depicting pass characteristics and phase characteristics of the circuit in FIG. 19A.

FIG. 19A is a diagram depicting a configuration of a circuit in which the phase shift circuit 16 has been added on the input side of the filter unit 17. FIG. 19B is a graph depicting pass characteristics (solid line g3) and phase characteristics (solid line h3) of the circuit depicted in FIG. 19A. Note that the dashed line j in FIG. 19B depicts the phase characteristics of the capacitance CB in FIG. 16A. It is evident from FIG. 19B that due to adding the phase shift circuit 16 to the filter unit 17, the phase changes by approximately −60°, and the phase in the suppression band on the passband low frequency side is approximately −80° to −110°.

In the vicinity of 1790 MHz in the graph of FIG. 19B, a difference D between the phase of the phase shift circuit 16 and the filter unit 17 depicted by the solid line g3 and the phase of the bridging capacitance CB depicted by the dashed line j is approximately 180°. In other words, the phase difference D between these two in the suppression band on the passband low frequency side is approximately 180° (antiphase).

From these results, it is to be expected that by adding the bridging capacitance CB that bridges between the input terminal In and the output terminal Out to the circuit depicted in FIG. 19A to obtain the configuration depicted in FIG. 15, the output signal in the suppression band is reduced. In other words, it can be expected that in the suppression band, the current that has passed through the bridging capacitance CB and the current that has passed through the phase shift circuit 16 and the filter unit 17 will be mutually antiphase and cancel each other out, and the output signal will be reduced (will be an attenuation pole).

Figure 20:
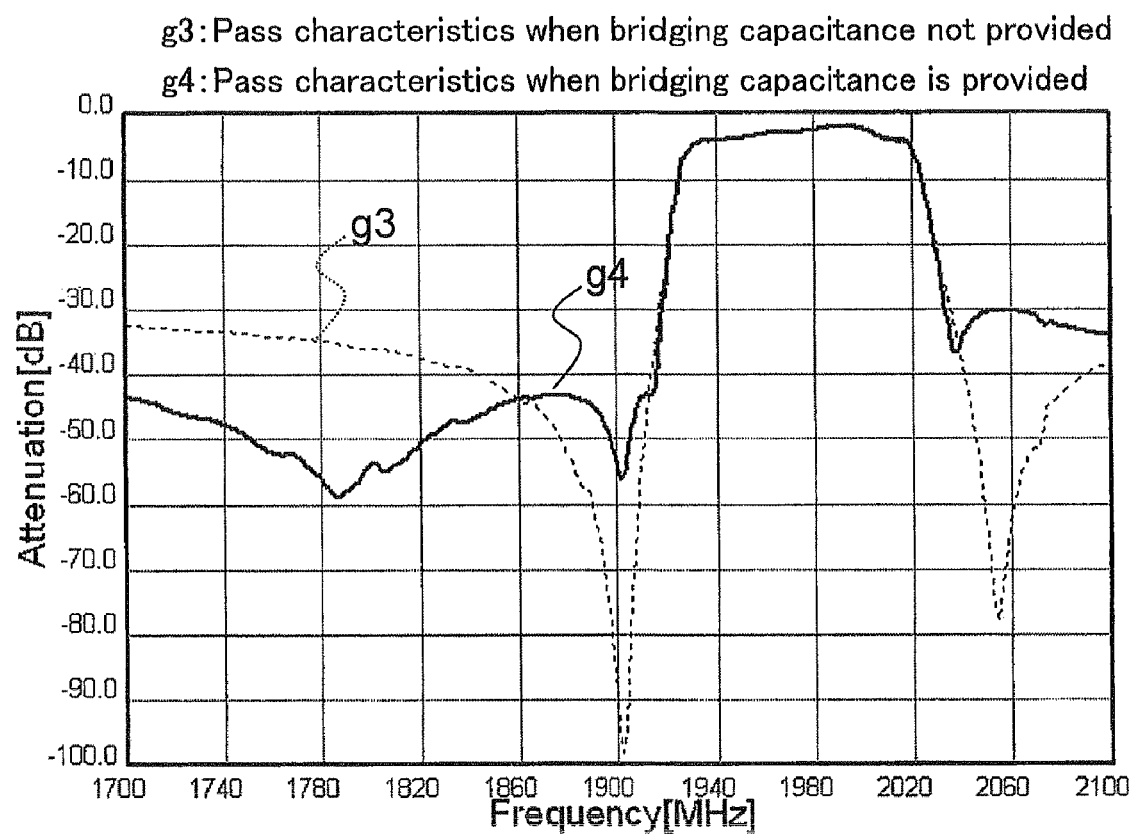
FIG. 20 is a graph depicting pass characteristics of a circuit in which the bridge capacitance CB has been added to the circuit depicted in FIG. 19A.

FIG. 20 is a graph depicting pass characteristics (solid line g4) of a circuit configured likewise to FIG. 15 by adding the bridging capacitance CB to the circuit depicted in FIG. 19A. As expected, the graph depicted in FIG. 20 depicts that an attenuation pole appears in the vicinity of 1790 MHz, and the degree of suppression of the filter on the passband low frequency side has been improved. In this way, by configuring a circuit as depicted in FIG. 15, it is possible to cause an attenuation pole to appear in the suppression band and realize a filter having a high degree of suppression.

Note that if the value of the electrostatic capacitance of the bridging capacitance CB is changed, the phase of the current that passes through the bridging capacitance CB changes. The frequency of the attenuation pole can therefore be arbitrarily controlled by changing the value of the electrostatic capacitance of the bridging capacitance CB.

Phase Shift Circuit Variations

Besides the circuit configuration depicted in FIG. 18A, the phase shift circuit (phase changing element) 16 used in the present embodiment can have, for example, the circuit configurations depicted in FIGS. 21A to 21C. The phase shift circuits in FIGS. 21A and 21B both have a configuration in which a coil L is connected in series and a capacitor C is connected in parallel. The circuit in FIG. 21B is a so-called LCL-T circuit. The coil L and the capacitor C can be realized by, for example, a chip part or an integrated passive device (IPD). Also, as depicted in FIG. 21C, the phase shift circuit may be configured by a transmission line 18 such as a distributed constant stripline or a micro stripline.

Depending on the initial phase in the suppression band of the filter, there are cases in which the phase shift circuit delays the phase, and cases in which the phase shift circuit advances the phase. In the case of advancing the phase, it is possible to use, for example, the phase shift circuits depicted in FIGS. 22A to 22D. The phase shift circuits in FIGS. 22A to 22C each have a configuration in which the capacitor C is connected in series, and the coil L is connected in parallel. The phase shift circuit in FIG. 22D is configured by the transmission line 18.

Note that the above phase shift circuit variations can be applied to the other embodiments as well, and the phase shift circuits depicted in FIG. 4A to FIG. 4D can be employed as the phase shift circuit of the present embodiment as well.

Filter Unit 17 Variations

Figure 23:
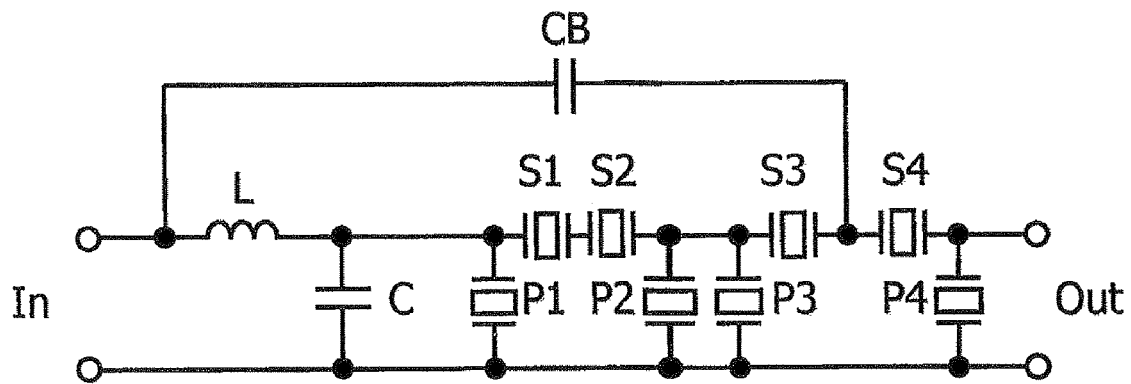
FIG. 23 is a diagram depicting a configuration in which the capacitance CB has been added so as to span a phase shift circuit 16 and a portion of the filter unit 17.

Even if the bridging capacitance CB is not added to the outermost side of the phase shift circuit 16 and the filter unit 17, the bridging capacitance CB may be added so as to bridge the input terminal In side of the phase shift circuit 16 and an intermediate portion of the filter unit 17, as depicted in FIG. 23 for example. In the example in FIG. 23, the bridging capacitance CB is provided so as to span the phase shift circuit 16 and a portion of the filter elements in the stages configuring the ladder filter. Even if the bridging capacitance CB is provided so as to span the phase shift circuit 16 and a portion of the filter unit 17 in this way, according to the same principle as described above, the degree of suppression of the filter can be increased.

Figure 24:
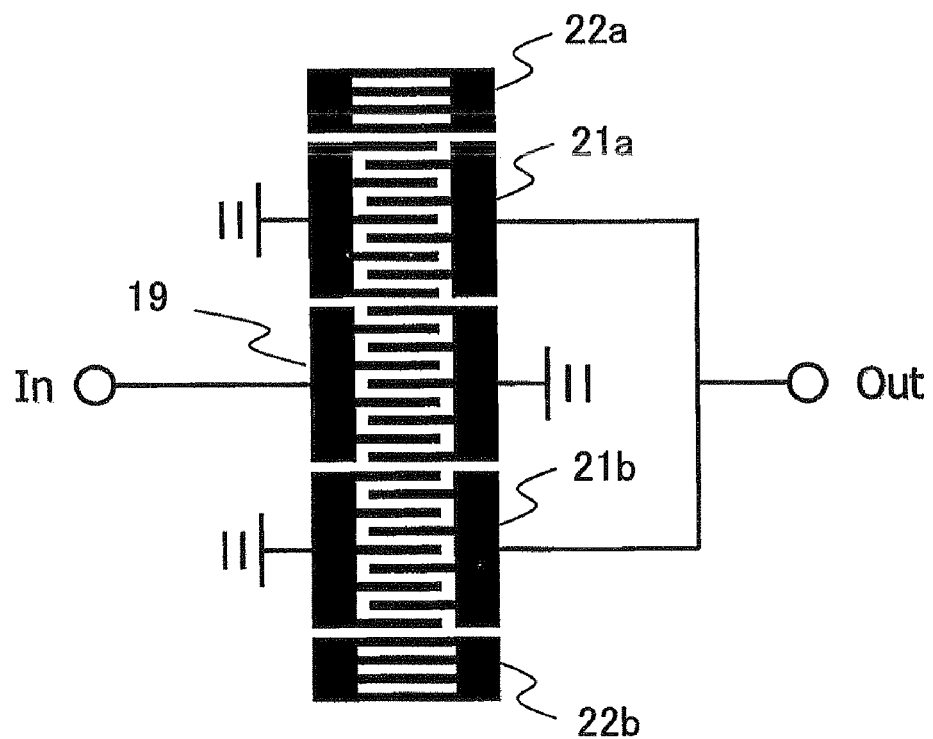
FIG. 24 is a diagram depicting an example of a configuration of a double-mode surface acoustic wave filter.

Although the filter unit 17 is configured by a ladder filter as one example in the present embodiment, the filter unit 17 may be various other types of filters. For example, a double-mode surface acoustic wave filter can be used. FIG. 24 is a diagram depicting an example of a configuration of a double-mode surface acoustic wave filter. The double-mode surface acoustic wave filter in FIG. 24 includes an input IDT 19 to which an input terminal In is connected, output IDTs 21a and 21b that are provided on respective sides of the input IDT 19, and reflectors 22a and 22b that are provided on the outer sides of the output IDTs 21a and 21b. The output IDTs 21a and 21b are connected to an output terminal Out.

Note that the bridging capacitance CB may be realized by a chip part or an IPD, and may be manufactured on a filter chip. Also, as described later, the bridging capacitance CB can be formed on a substrate or in a package for implementing the filter.

Embodiment 4

In Embodiment 4, the filter in Embodiment 3 has been applied to a balanced filter.

Figure 25A:
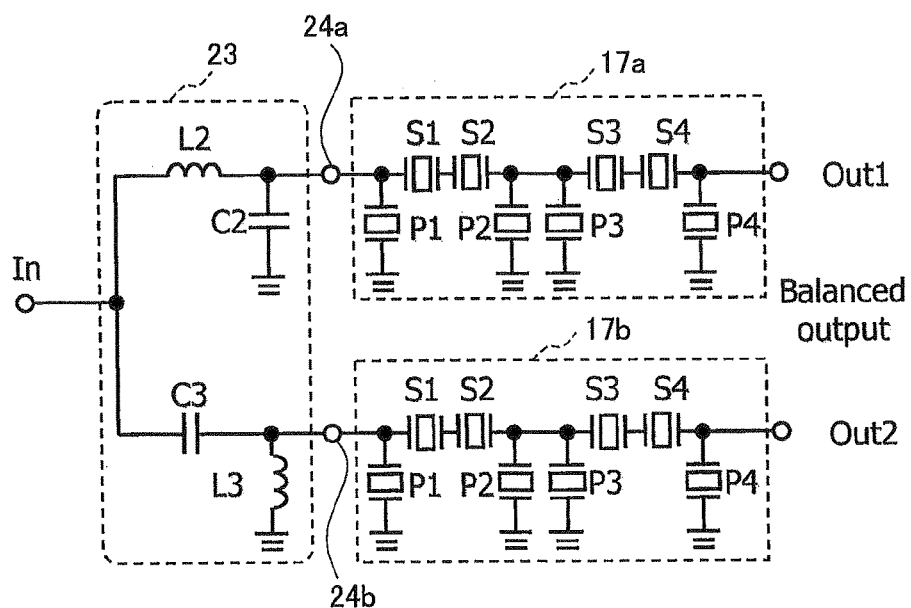
FIG. 25A is a diagram depicting a configuration of a balanced filter to which a bridge capacitance has not been added.

FIG. 25A is a diagram depicting a configuration of a balanced filter in which the bridge capacitance CB has not been added. This balanced filter is configured by a balun 23 and filter units (ladder filters) 17a and 17b. Here, the balun 23 is a balanced-unbalanced converter that has a common terminal (Input terminal In), an output terminal 24a that delays the phase of signals that have been input to the common terminal by approximately 90° and outputs the resulting signals, and an output terminal 24b that advances the phase of signals that have been input to the common terminal by approximately 90° and outputs the resulting signals. In the example depicted in FIG. 25A, the balun 23 is configured using coils L2 and L3, and capacitors C2 and C3. The two output terminals 24a and 24b of the balun are respectively connected to the filter units 17a and 17b that are ladder filters, thus configuring an unbalanced input-to-balanced output balanced filter. The filter units 17a and 17b are the same as the filter unit 17 in the above Embodiment 3.

The type of balanced filter depicted in FIG. 25A is configured such that the filter units 17a and 17b are connected to the phase shift circuit on the line between the input terminal In and one output terminal Out1, and the line between the input terminal In and another output terminal Out2, respectively. For this reason, it is thought that the effect of improving the degree of suppression can be obtained by adding bridging capacitance CB of Embodiment 3 to either of the lines.

Figure 25B:
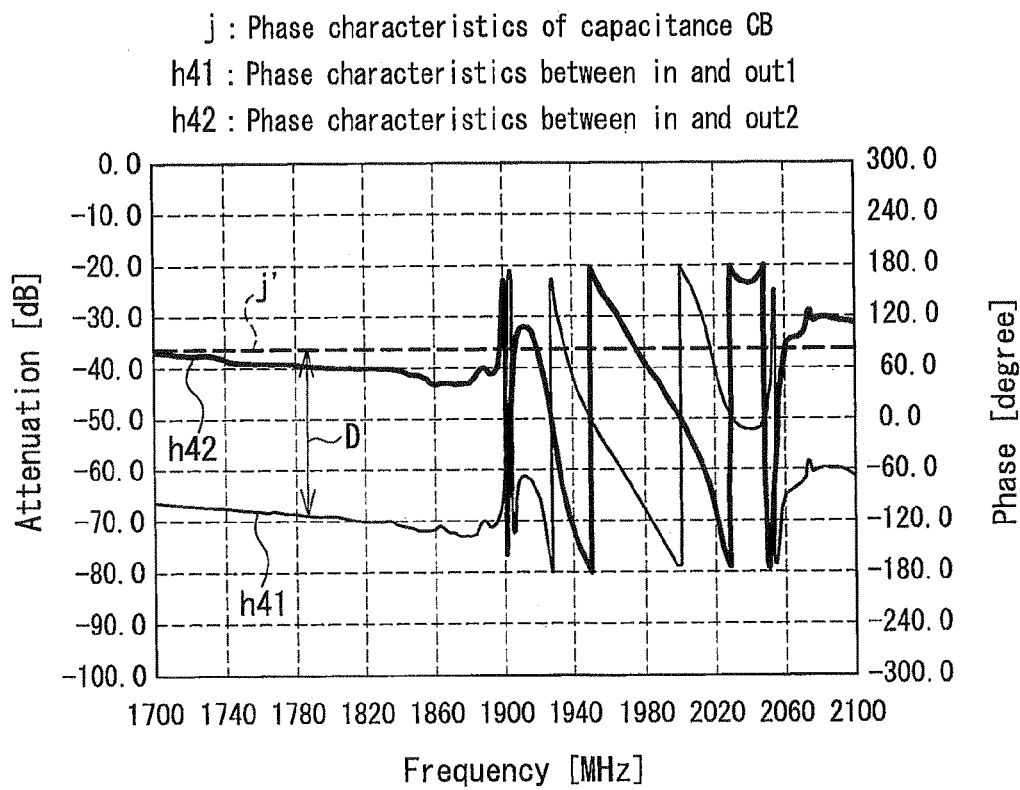
FIG. 25B is a graph depicting phase characteristics of the balanced filter in FIG. 25A.

FIG. 25B is a graph depicting, with respect to the balanced filter in FIG. 25A, phase characteristics between the input terminal In and the output terminal Out1 (solid line h41), and phase characteristics between the input terminal In and the output terminal Out2 (solid line h42). The graph in FIG. 25B was obtained as the result of performing calculation in the case in which the inductance of the coils L2 and L3 of the balun 23 was 5.74 nH, and the electrostatic capacitance of the capacitors C2 and C3 was 1.15 pF. Also, this graph also depicts the phase characteristics (dashed line j) of the capacitance CB (electrostatic capacitance=0.05 pF) depicted in FIG. 16A. When focus is placed on the phase characteristics on the low frequency side of the passband, it can be seen that the difference D between the phase of the capacitance CB and the phase between the input terminal In and the output terminal Out1 is approximately 180° (antiphase) in the vicinity of 1790 MHz. Accordingly, by configuring the filter such that the bridging capacitance CB that is approximately 0.05 pF has been added between the input terminal In and the output terminal Out1 (the configuration depicted in FIG. 26), it is thought that it is possible to cause an attenuation pole to appear in the suppression characteristics between the input terminal In and the output terminal Out1, and to improve the degree of suppression.

Figure 26:
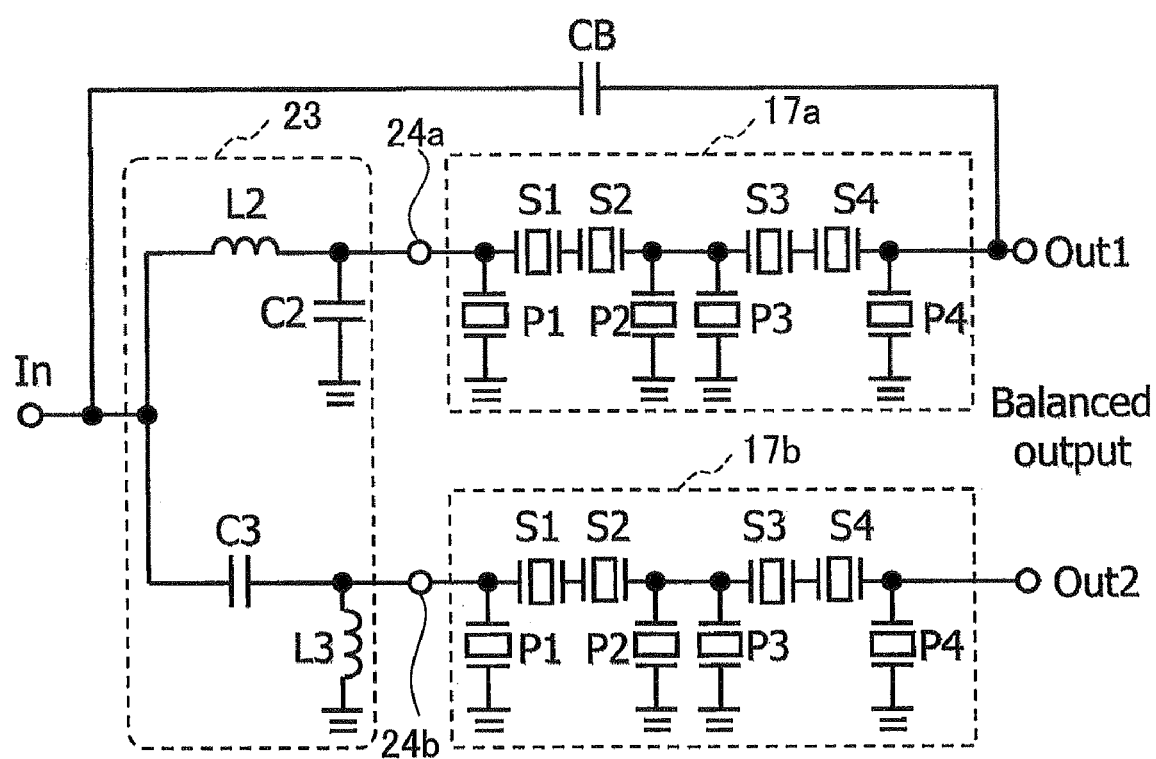
FIG. 26 is a diagram depicting a configuration of a balanced filter in Embodiment 4.
Figure 27A:
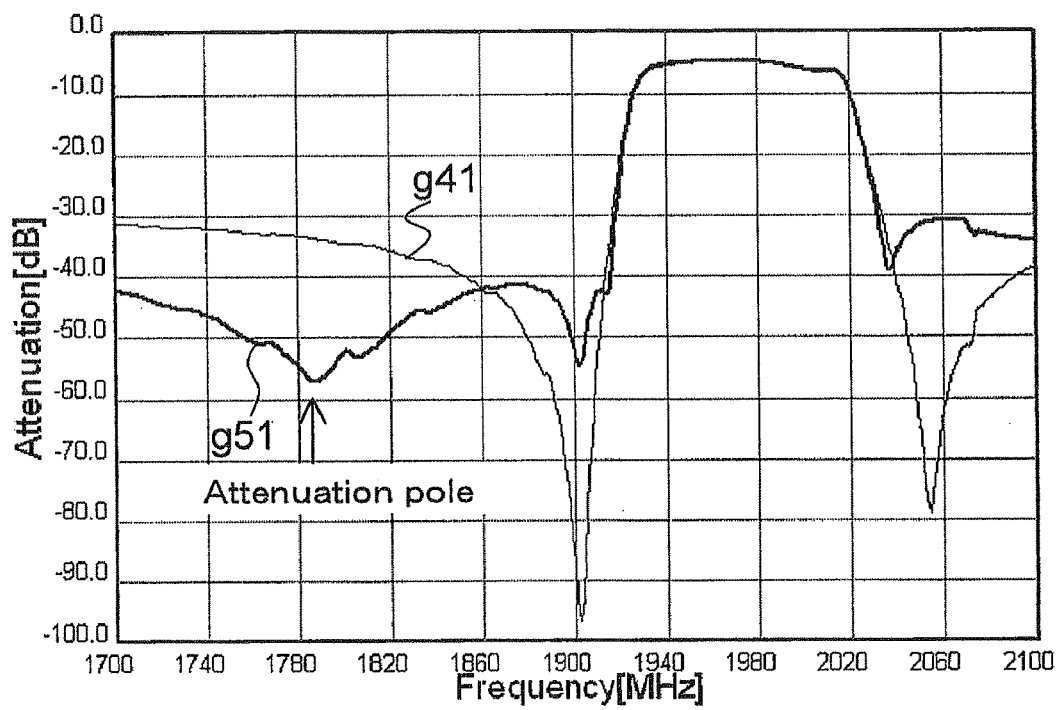
FIG. 27A is a graph depicting results of calculating pass characteristics (solid line g51) between an input terminal In and an output terminal Out1 in the balanced filter in FIG. 26.
Figure 27B:
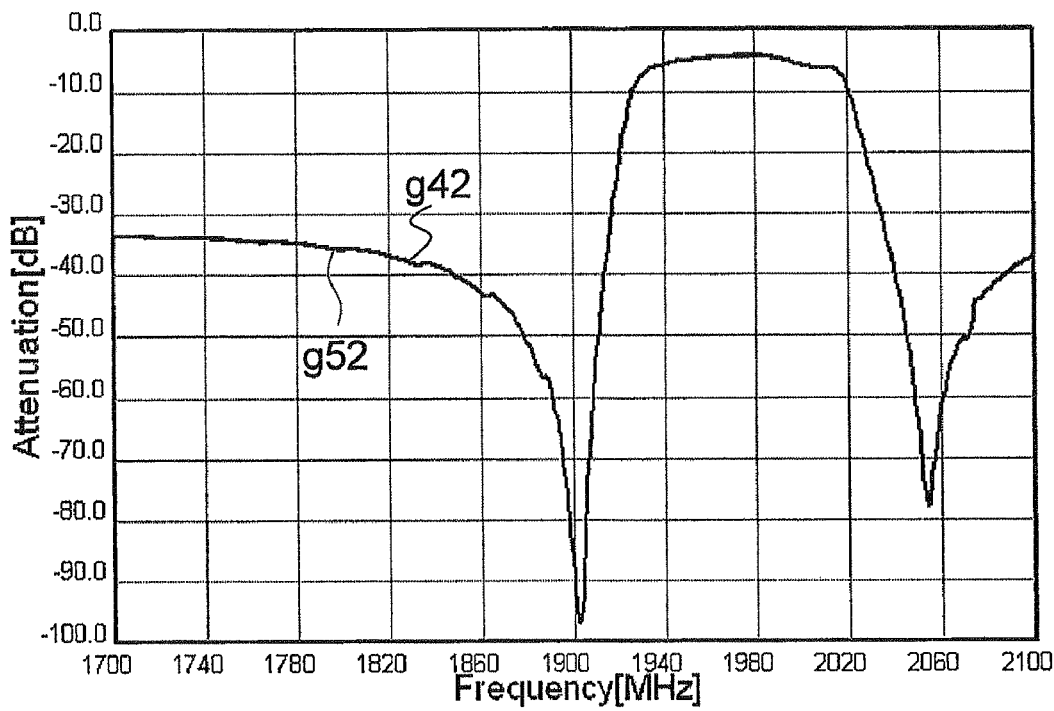
FIG. 27B is a graph depicting results of calculating pass characteristics (solid line g52) between the input terminal In and an output terminal Out2 in the balanced filter in FIG. 26.
Figure 28:
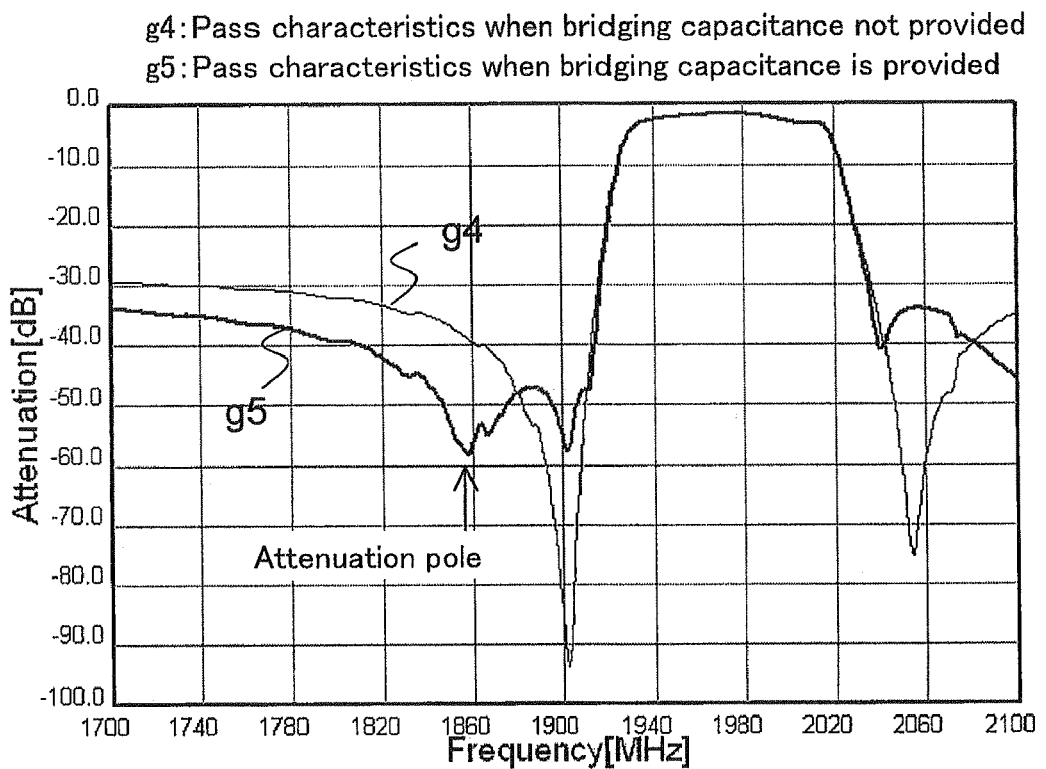
FIG. 28 is a graph depicting results of calculating pass characteristics (solid line g4) in the case of synthesizing balance in the balanced filter in FIG. 26 and analyzing the balanced filter as a single-end filter.

Specifically, FIG. 26 is a diagram depicting a configuration of a balanced filter in the present embodiment. FIG. 27A is a graph depicting results of calculating pass characteristics between the input terminal. In and the output terminal Out1 (solid line g51) in the balanced filter configured as depicted in FIG. 26. This graph also depicts pass characteristics (solid line g41) of a balanced filter configured without the addition of the bridging capacitance CB (the configuration depicted in FIG. 25A). It is evident from the graph that adding the bridging capacitance CB causes an attenuation pole to appear in the vicinity of 1790 MHz in the pass characteristics between the input terminal In and the output terminal Out1. As a result, the degree of suppression on the low frequency side of the passband has been improved. On the other hand, FIG. 27B is a graph depicting pass characteristics between the input terminal In and the output terminal Out2 (solid line g52). The solid line g52 is superimposed with the pass characteristics in the case in which the bridging capacitance CB is not provided (solid line g42). In other words, the pass characteristics are the same if the bridging capacitance CB is added or not added. FIG. 28 is a graph depicting results of calculating pass characteristics (solid line g4) in the case of synthesizing balance in the balanced filter in FIG. 26 and analyzing the balanced filter as a single-end filter. It is evident that if balance synthesis is performed, the attenuation pole moves toward the high frequency side, and the attenuation pole appears in the vicinity of 1860 MHz. In this way, it is also evident from the analysis in which balance synthesis was performed, that the degree of suppression on the low frequency side of the passband can be increased by adding the bridging capacitance CB.

Figure 29:
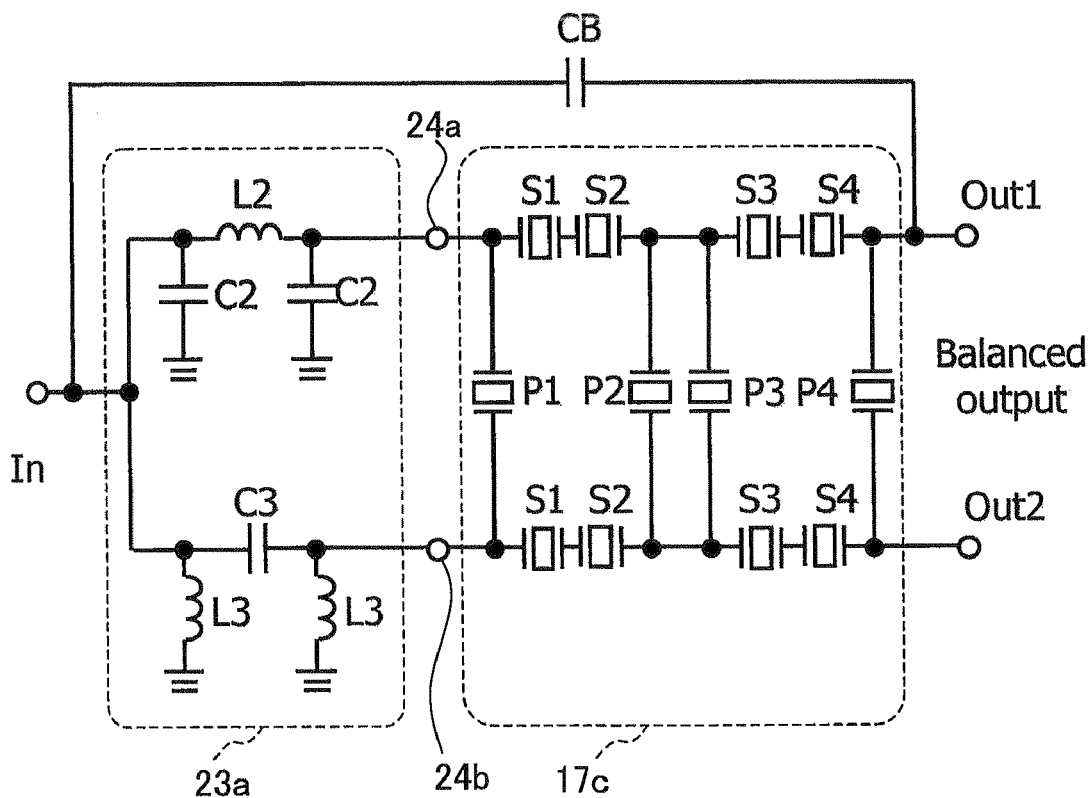
FIG. 29 is a variation of the balanced filter according to Embodiment 4.

FIG. 29 is a diagram depicting a variation of the balanced filter of the present embodiment. In this variation, the balanced filter includes a balun 23a, and a balanced input-to-balanced output ladder filter 17c connected to output terminals 24a and 24b of the balun 23a. The ladder filter 17c has a configuration in which parallel resonators P1 to P4 are connected so as to connect two lines on which series resonators S1 to S4 are connected. Also, as one example, a CLC π circuit and an LCL π circuit are used in the balun 23a.

Exemplary Duplexer Configuration

Figure 30:
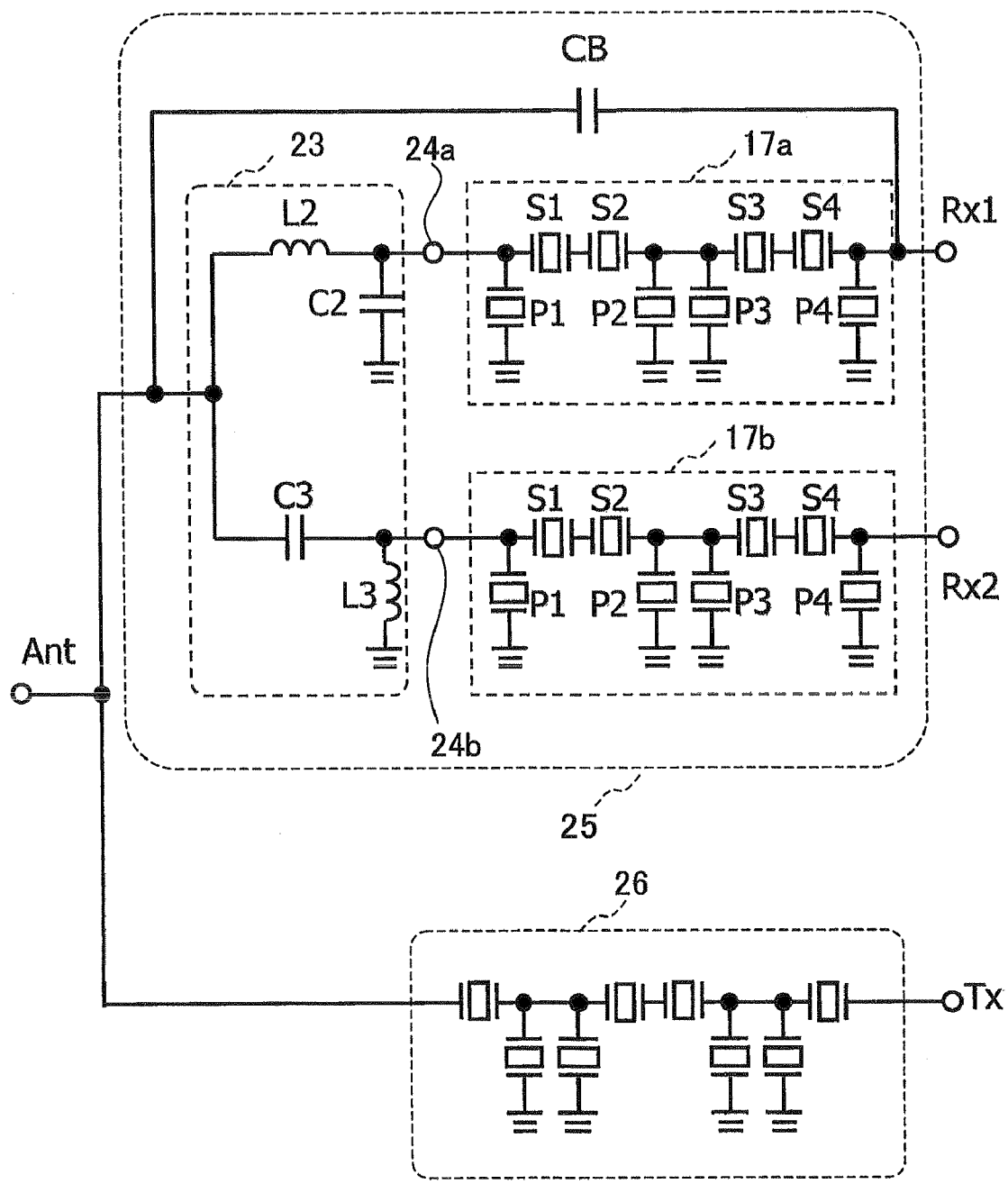
FIG. 30 is a diagram depicting an example of a configuration of a duplexer including the balanced filter depicted in FIG. 26.

FIG. 30 is a diagram depicting an example of a configuration of a duplexer including the balanced filter depicted in FIG. 26. In this duplexer, a reception filter 25 and a transmission filter 26 are connected to an antenna terminal Ant. Reception terminals Rx1 and Rx2 are the terminals on the output side of the reception filter 25, and a transmission terminal Tx is the terminal on the input side of the transmission filter 26. In other words, in this duplexer, the balanced filter depicted in FIG. 26 is used as the reception filter (Rx filter) 25. The reception terminals Rx1 and Rx2 are therefore balanced output terminals. The transmission filter 26 is configured by a ladder filter.

Figure 31A:
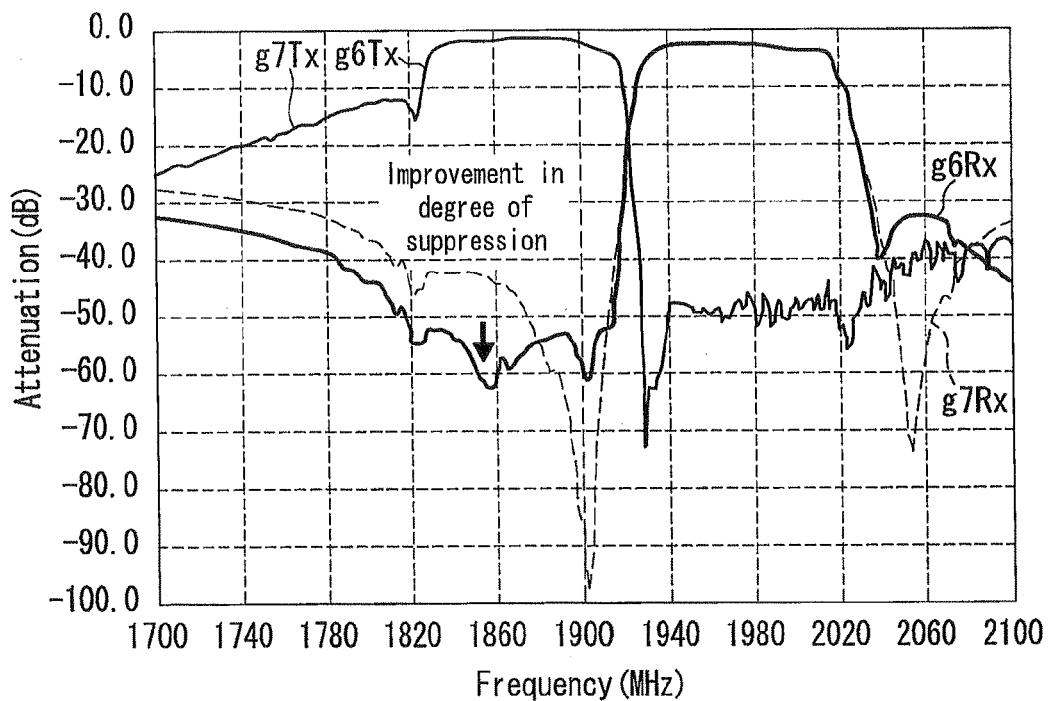
FIG. 31A is a graph depicting results of calculating characteristics (after balance synthesis) of the balanced duplexer depicted in FIG. 30.

FIG. 31A is a graph depicting results of calculating characteristics (after balance synthesis) of the balanced duplexer depicted in FIG. 30. In this graph, a solid line g6Rx indicates characteristics of the reception filter 25, and a solid line g6Tx indicates characteristics of the transmission filter 26. Also, dashed lines g7Rx and g7Tx respectively indicate characteristics of a reception filter and a transmission filter in a balanced duplexer in which a balanced filter configured without the bridging capacitance CB (the configuration depicted in FIG. 25A) is used as the reception filter. (The solid line g6Tx and the dashed line g7Tx are substantially superimposed.) It is evident from FIG. 31A that by adding the bridging capacitance CB, output signals are cancelled out in one of the reception terminals Rx, and the degree of suppression on the low frequency side of the passband of the reception filter has been improved.

Figure 31B:
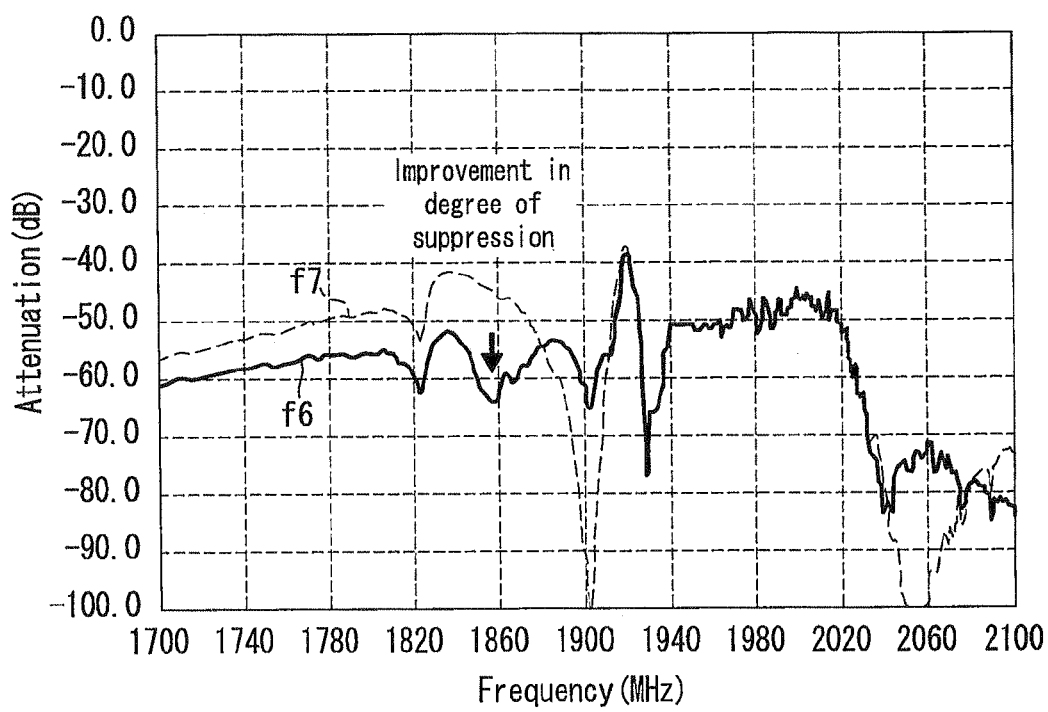
FIG. 31B is a graph depicting isolation characteristics (solid line f6) of the balanced duplexer depicted in FIG. 30.

FIG. 31B is a graph depicting isolation characteristics (solid line f6) between the transmission terminal Tx and the reception terminals Rx of the balanced duplexer depicted in FIG. 30. Note that a solid line f7 indicates isolation characteristics of a balanced duplexer using a balanced filter configured without the bridging capacitance CB (the configuration depicted in FIG. 25A). It can be confirmed from FIG. 31B that the isolation characteristics between the transmission terminal Tx and the reception terminals Rx also reflect the suppression characteristics of the reception filter 25, and are significantly improved. Note that similar effects can be obtained even if the duplexer is configured with use of a filter according to Embodiment 3.

Example of Duplexer Mounting

Figure 32:
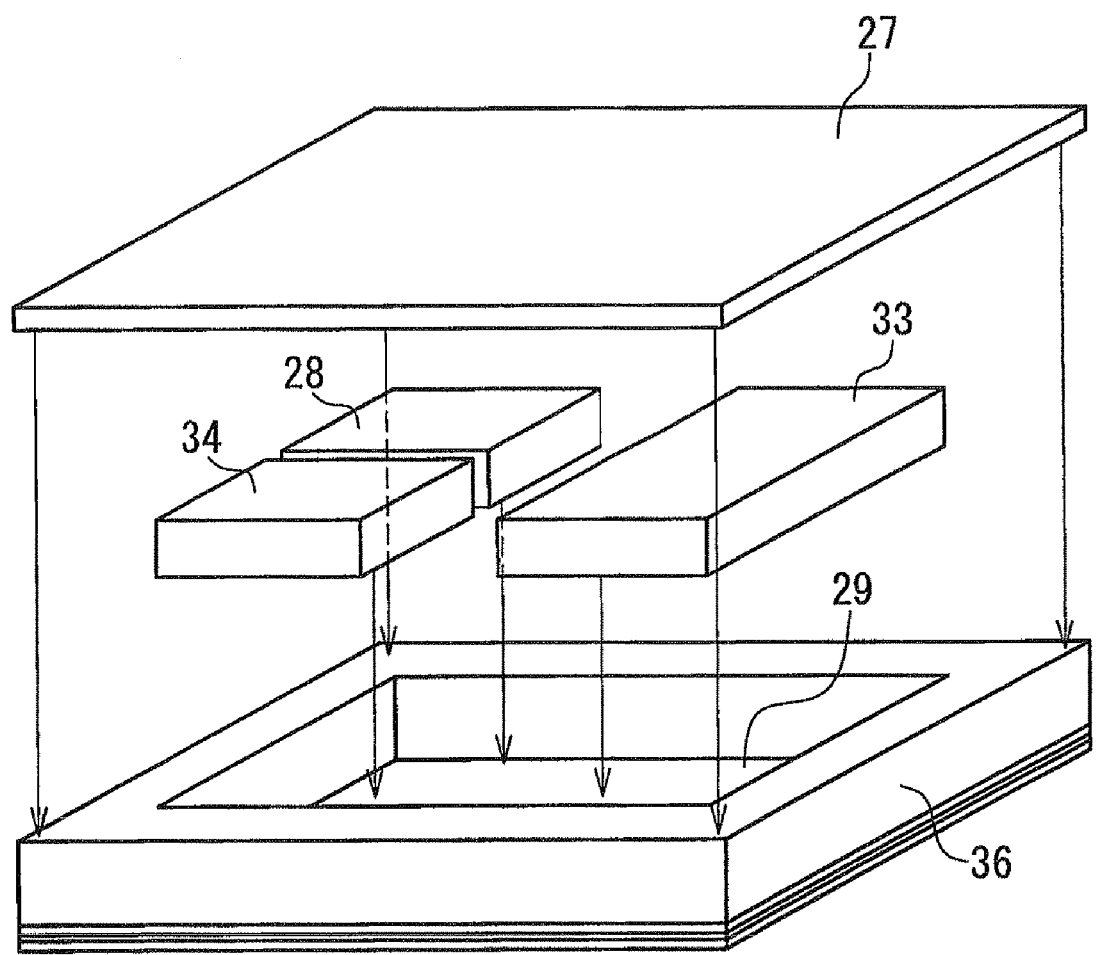
FIG. 32 is a graph depicting an example of mounting of the balanced duplexer depicted in FIG. 30.

FIG. 32 is a diagram depicting an example of mounting of the balanced duplexer depicted in FIG. 30. In the example depicted in FIG. 32, a balun chip 28, a transmission filter chip 33, and a reception filter chip 34 are flip-chip mounted in a ceramic package 36 that has a cavity 29. The balun chip 32 is an IPD chip that forms the balun 23 in FIG. 30. The transmission filter chip 33 is a chip that forms the transmission filter 26, and the reception filter chip 34 is a chip that forms the filter units 17a and 17b. Conduction between these chips and the ceramic package 36 is achieved by, for example, Au bumps. As a cap, a metal lid 27 is provided on the top part of the ceramic package 36 in which these chips have been mounted. Thus, the cavity 29 is hermetically sealed.

The ceramic package 36 can be, for example, a layered package including a die attach layer to which the chips are mounted, and an intermediate layer thereunder. In this case, foot pads are provided on the back side of the intermediate layer, thus forming a foot pad layer. Note that the bridging capacitance CB that bridges between the antenna terminal. Ant and the reception terminal Rx1 can be formed, for example, in the ceramic package 36 as described later.

Figure 33:
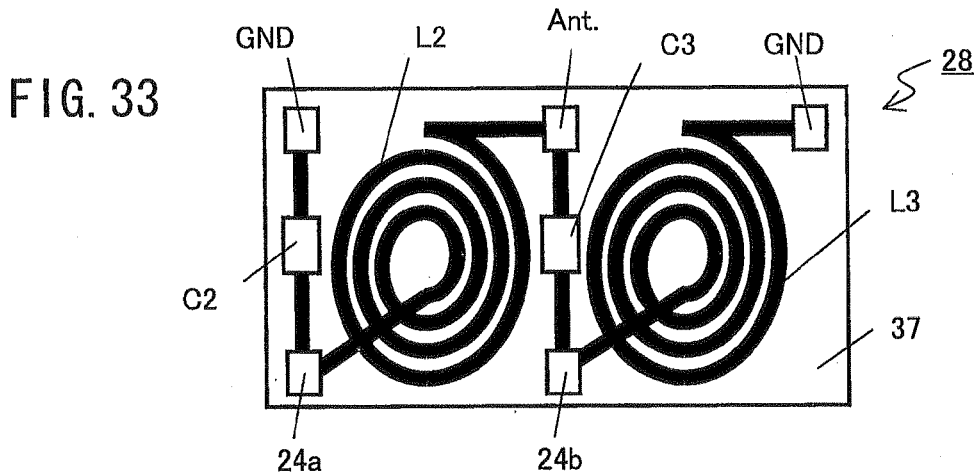
FIG. 33 is a plan view depicting a configuration of a balun chip.

FIG. 33 is a plan view depicting a configuration of the balun chip 28. In the example depicted in FIG. 33, a coil L2 is formed between the antenna terminal Ant and the output terminal 24a on a quartz substrate 37, and a coil L3 is formed between the output terminal 24b and a GND terminal. The coils L2 and L3 can be formed, for example, by spiral coils that employ a metal film such as copper. Also, a capacitor C3 is formed between the antenna terminal Ant and the output terminal 24b, and a capacitor C2 is formed between the output terminal 24a and a GND terminal. The capacitors C2 and C3 are formed, for example, with use of MIM capacitors.

Figure 34:
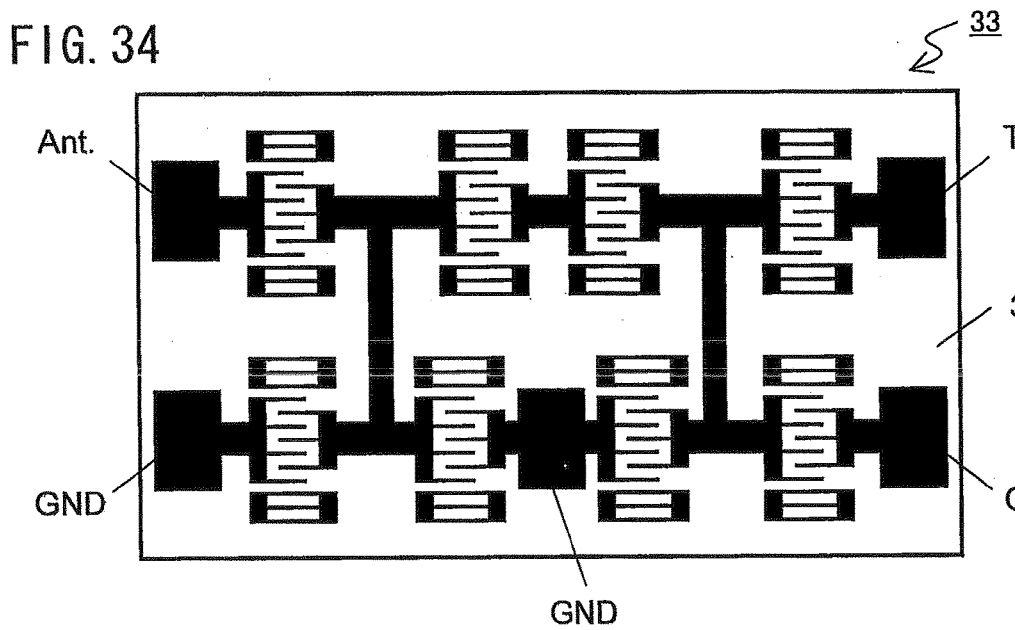
FIG. 34 is a plan view depicting a configuration of a transmission filter chip.

FIG. 34 is a plan view depicting a configuration of the transmission filter chip 33. In the example depicted in FIG. 34, the series resonators and the parallel resonators of the ladder filter are formed from surface acoustic wave elements provided on a piezoelectric substrate 38. The surface acoustic wave elements are connected to the antenna terminal Ant, the reception terminal Tx, or ground terminals GND via line patterns.

Figure 35:
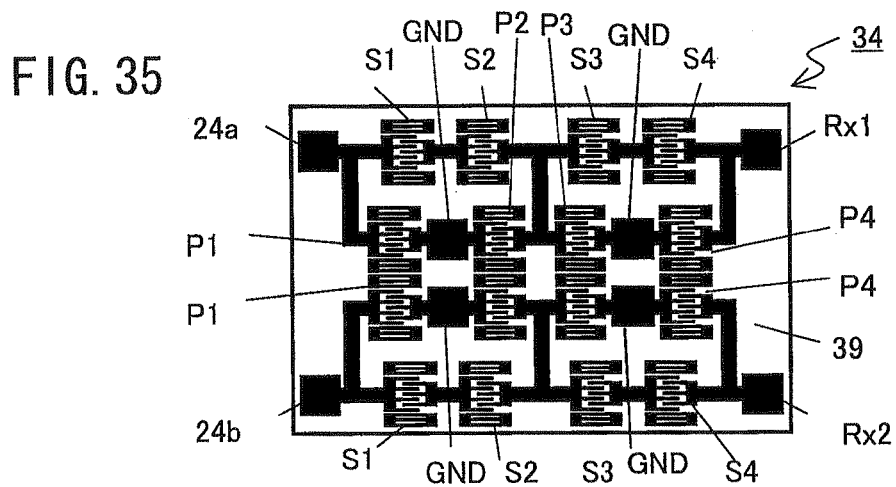
FIG. 35 is a plan view depicting a configuration of a reception filter chip.

FIG. 35 is a plan view depicting a configuration of the reception filter chip 34. In the example depicted in FIG. 35, the series resonators S1 to S4 and the parallel resonators P1 to P4 of the ladder filter are formed from surface acoustic wave elements provided on a piezoelectric substrate 39. The surface acoustic wave elements are connected to the output terminals 24a and 24b, the reception terminals Rx1 and Rx2, or ground terminals GND via line patterns. Note that the reference numerals of the parts depicted in FIGS. 33 to 35 correspond to the reference numerals of the parts depicted in FIG. 30.

Figure 36A:
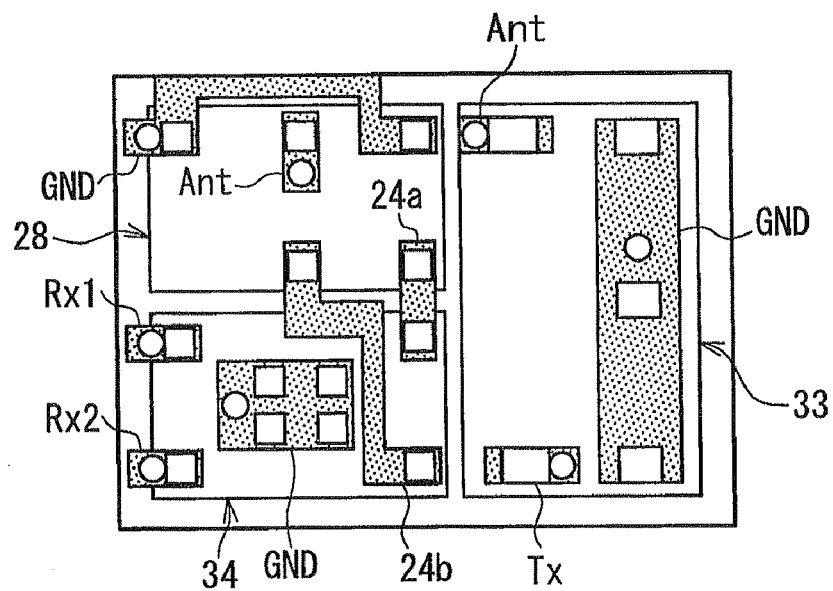
FIG. 36A is a diagram depicting an example of a wiring layout at the surface of a die attach layer.
Figure 36B:
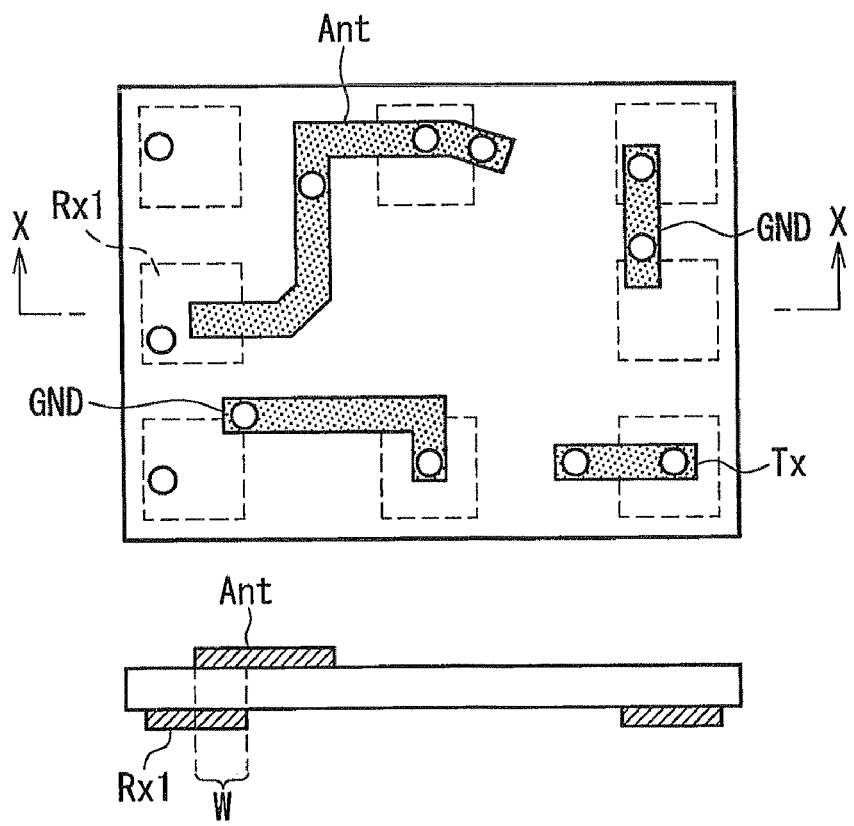
FIG. 36B is a diagram depicting an example of a wiring layout at the surface of an intermediate layer, and a cross-section of the intermediate layer taken along line X-X.
Figure 36C:
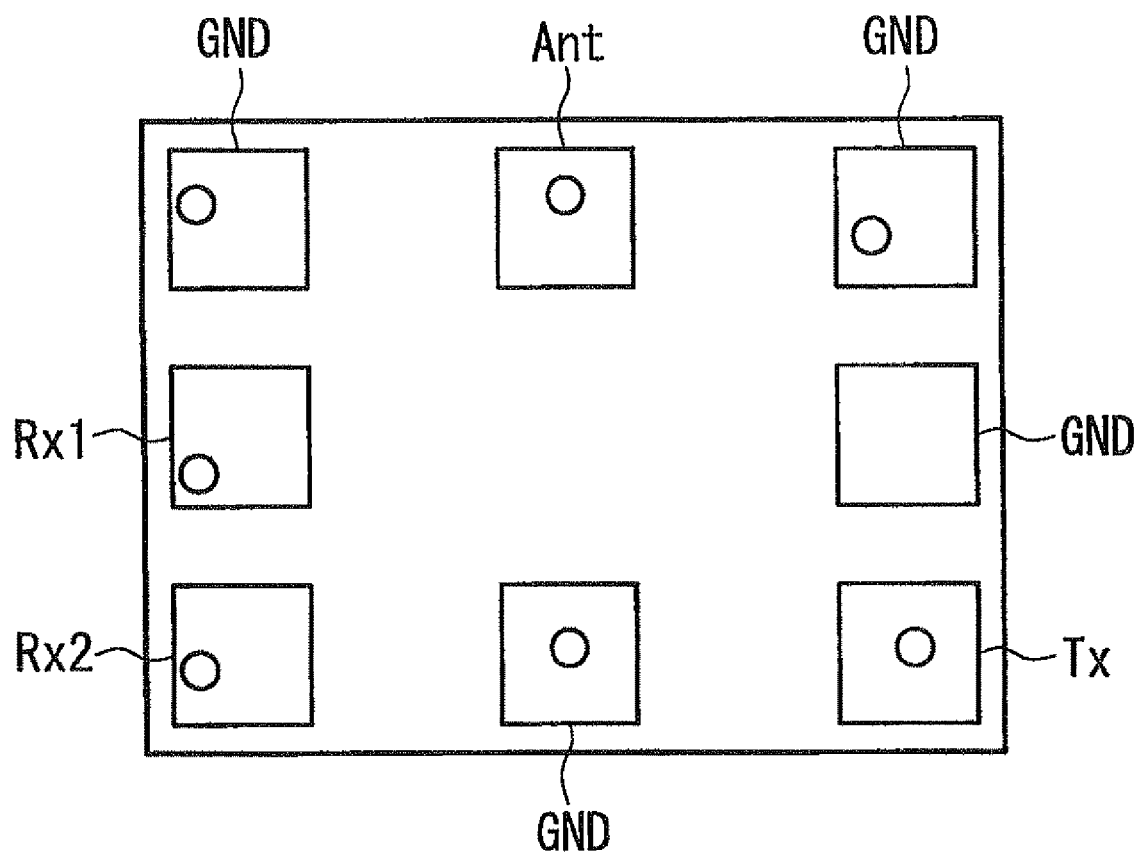
FIG. 36C is a diagram depicting an arrangement of foot pads in a foot pad layer.

Next is a description of an example of a configuration in the case in which the bridging capacitance CB is formed in the ceramic package 36. FIG. 36A is a diagram depicting an example of a wiring layout in the surface of the die attach layer of the ceramic package 36. FIG. 36B is a diagram depicting an example of the wiring layout in the surface of the intermediate layer that is a layer below the die attach layer, and a cross-section of the intermediate layer taken along line X-X. FIG. 36C is a diagram depicting an arrangement of the foot pads in the foot pad layer that is a layer below the die attach layer.

In FIGS. 36A to 36C, blank rectangles and squares indicate bumps that connect the chips and the ceramic package 36. Also, blank circles indicate vias that conduct electricity to other layers. Line patterns connect bumps to bumps, vias to vias, or bumps to vias. Note that the reference numerals of the line patterns in FIGS. 36A to 36C are the reference numerals of the terminals that are connected to by the line patterns indicated by such reference numerals. The reference numerals of the terminals correspond to the reference numerals depicted in FIG. 30. Also, FIGS. 36A to 36C depict at least the layout of the lines and terminals that relate to the bridging capacitance CB, and other aspects of the layout have been omitted.

For example, in the die attach layer depicted in FIG. 36A, the antenna terminal Ant of the balun chip 28 is connected to a via by a line pattern, and the antenna terminal Ant of the transmission filter 33 is also connected to a via by a line pattern. These vias conduct electricity to the intermediate layer depicted in FIG. 36B, and in the intermediate layer, these vias are connected to each other via a line pattern (the line pattern connected to the Ant terminals). Note that in the example depicted in FIG. 36B, the foot pads provided on the back side of the intermediate layer are indicated by dotted lines. One end part of the line pattern connected to the Ant terminals in this intermediate layer is disposed over the foot pad for the reception terminal Rx1. By configuring the duplexer such that the line pattern (wiring) that connects to the antenna terminal Ant extends to a position directly above the foot pad for the reception terminal Rx1 in this way, this line pattern and foot pad for the reception terminal Rx1 form a parallel plate capacitor in which ceramic is the dielectric layer (see the cross-sectional diagram in FIG. 36B). A desired capacitance value can therefore be obtained by adjusting an overlapping portion W of the line pattern and the foot pad. Consequently, it is possible to arbitrarily control the attenuation pole frequency with use of the line pattern.

In this way, the bridging capacitance CB can be realized by a simple configuration. It is therefore possible to easily obtain a desired filter suppression characteristic without bringing about problems such as an increase in package size, and interference due to increased complexity of the wiring structure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:
1. A filter comprising:
a filter unit that passes and outputs, among input signals, a signal in a passband;

a phase shift circuit that is connected to an input side or an output side of the filter unit, and that shifts a phase of signals; and a bridging capacitance that is provided so as to span the phase shift circuit and the filter unit, and wherein a phase shift angle of the phase shift circuit is set so that a phase of a signal that has been output via the bridging capacitance and a phase of a signal that has been output via the phase shift circuit and the filter unit are antiphase outside the passband of the filter unit.

2. The filter according to claim 1, comprising:

a balanced-unbalanced converter that has a common terminal, divides a signal that has been input from the common terminal into two signals that are mutually antiphase, and output the two signals via two output terminals respectively, wherein the filter unit includes two filter units respectively connected to the two output terminals via which the balanced-unbalanced converter performs output, the balanced-unbalanced converter is included in the phase shift circuit, and the bridging capacitance is provided so as to bridge the common terminal and either one of output sides of the two filter units that are respectively connected to the two output terminals.

3. The filter according to claim 1, wherein the phase shift circuit and the filter unit have been formed in a package or on a substrate, and the bridging capacitance has been formed in the package or the substrate.

4. The filter according to claim 1, wherein at least a portion of the phase shift circuit is configured by a lumped constant circuit.

5. The filter according to claim 4, wherein the phase shift circuit having at least a portion configured by a lumped constant circuit includes an inductor and a capacitor, and the inductor is connected in parallel to a signal line.

6. A demultiplexer that has a common terminal, a transmission terminal, and a reception terminal, comprising:

a transmission filter that is connected between the common terminal and the transmission terminal;

a reception filter that is connected between the common terminal and the reception terminal; and a phase shift circuit that is connected in series to the reception filter between the common terminal and the reception terminal, wherein a node on a line from the phase shift circuit to the common terminal or the transmission terminal, and a node on a line from the phase shift circuit to the reception terminal are coupled via a reactance, and wherein the phase shift circuit performs phase adjustment so that a phase difference between a signal from the node on the line from the phase shift circuit to the common terminal or the transmission terminal that has passed through the coupling via the reactance and arrived at the reception terminal, and a signal that has passed through the phase shift circuit and arrived at the reception terminal is substantially 180 degrees.

7. The demultiplexer according to claim 6, wherein the phase shift circuit is provided on a reception terminal side of the reception filter, and a node on a line from the reception filter to the transmission filter or the common terminal, and a node on a line on the reception terminal side of the phase shift circuit are coupled via the reactance.

8. The demultiplexer according to claim 6, wherein a node on a line from the transmission filter to the transmission terminal, and a node on a line from the phase shift circuit to the reception terminal are coupled via a reactance.

9. The demultiplexer according to claim 6, wherein the coupling via the reactance is capacitive coupling.

10. The demultiplexer according to claim 6, wherein at least a portion of the phase shift circuit is configured by a lumped constant circuit.

11. The demultiplexer according to claim 10, wherein the phase shift circuit having at least a portion configured by a lumped constant circuit includes an inductor and a capacitor, and the inductor is connected in parallel to a signal line.

12. The demultiplexer according to claim 6, wherein the transmission filter and the reception filter are stored in a package, and the coupling via the reactance is formed by wiring of the package.

13. A module including the demultiplexer according to claim 6, the reception filter and the transmission filter of the demultiplexer being mounted on a substrate that the module comprises, and the coupling via the reactance being formed by wiring on the substrate.

14. A communication device comprising the module according to claim 13.

* * * * *